United States Patent
Li et al.

(10) Patent No.: US 11,683,051 B2
(45) Date of Patent: *Jun. 20, 2023

(54) METHOD AND APPARATUS FOR DATA PROCESSING WITH STRUCTURED LDPC CODES

(71) Applicant: ZTE Corporation, Guangdong (CN)

(72) Inventors: Liguang Li, Guangdong (CN); Jun Xu, Guangdong (CN); Jin Xu, Guangdong (CN)

(73) Assignee: ZTE Corporation, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/493,612

(22) Filed: Oct. 4, 2021

(65) Prior Publication Data

US 2022/0038115 A1    Feb. 3, 2022

Related U.S. Application Data

(63) Continuation of application No. 16/730,962, filed on Dec. 30, 2019, now Pat. No. 11,139,835, which is a
(Continued)

(30) Foreign Application Priority Data

May 13, 2016 (CN) .......................... 201610322409.4
Sep. 30, 2016 (CN) .......................... 201610879343.9

(51) Int. Cl.
*H03M 13/00* (2006.01)
*H03M 13/11* (2006.01)
(Continued)

(52) U.S. Cl.
CPC ....... *H03M 13/1148* (2013.01); *H03M 13/00* (2013.01); *H03M 13/11* (2013.01);
(Continued)

(58) Field of Classification Search
CPC ........... H03M 13/1148; H03M 13/114; H03M 13/11; H03M 13/116; H03M 13/6516;
(Continued)

(56) References Cited

U.S. PATENT DOCUMENTS

2007/0094580 A1* 4/2007 Livshitz ............. H03M 13/1185
714/779
2008/0178065 A1   7/2008 Khandekar et al.
(Continued)

FOREIGN PATENT DOCUMENTS

CN           1953335 A    4/2007
CN         101141133 A    3/2008
(Continued)

OTHER PUBLICATIONS

CNIPA, First Office Action for Chinese Patent Application No. 2013108793439 dated Feb. 13, 2020. 14 pages with translation.
(Continued)

*Primary Examiner* — Samir W Rizk
(74) *Attorney, Agent, or Firm* — Perkins Coie LLP

(57) ABSTRACT

The embodiments of the present disclosure provide a method and an apparatus for data processing with structured LDPC codes. The method includes: obtaining a code block size for structured LDPC coding; determining a coding expansion factor z based on at least one of the code block size, a parameter kb of a basic check matrix, a positive integer value p or the basic check matrix having mb rows and nb columns; and encoding a data sequence to be encoded, or decoding a data sequence to be decoded, based on the basic check matrix and the coding expansion factor. The present disclosure is capable of solving the problem in the related art associated with low flexibility in data processing with LDPC coding and improving the flexibility in data processing with LDPC coding.

15 Claims, 9 Drawing Sheets

Related U.S. Application Data continuation of application No. 16/171,314, filed on Oct. 25, 2018, now Pat. No. 10,523,237, which is a continuation of application No. PCT/CN2016/104744, filed on Nov. 4, 2016.

(51) Int. Cl.
*H03M 13/29* (2006.01)
*H03M 13/09* (2006.01)

(52) U.S. Cl.
CPC ........ *H03M 13/114* (2013.01); *H03M 13/116* (2013.01); *H03M 13/1137* (2013.01); *H03M 13/1185* (2013.01); *H03M 13/2906* (2013.01); *H03M 13/616* (2013.01); *H03M 13/6356* (2013.01); *H03M 13/6516* (2013.01); *H03M 13/09* (2013.01)

(58) Field of Classification Search
CPC ......... H03M 13/1137; H03M 13/1185; H03M 13/2906; H03M 13/00; H03M 13/6356; H03M 13/616; H03M 13/09
See application file for complete search history.

(56) References Cited

U.S. PATENT DOCUMENTS

| | | | |
|---|---|---|---|
| 2008/0298433 A1 | 12/2008 | Tiirola et al. | |
| 2010/0128660 A1* | 5/2010 | Becker | H04B 7/18543 370/316 |
| 2010/0251065 A1* | 9/2010 | Livshitz | H04L 1/0057 714/752 |
| 2010/0329308 A1 | 12/2010 | Kim et al. | |

FOREIGN PATENT DOCUMENTS

| | | |
|---|---|---|
| CN | 101217337 A | 7/2008 |
| CN | 101459430 A | 6/2009 |
| CN | 101601187 A | 12/2009 |
| CN | 101834613 A | 9/2010 |
| CN | 102412842 A | 4/2012 |
| CN | 102457286 A | 5/2012 |
| CN | 104868925 A | 8/2015 |

OTHER PUBLICATIONS

Communication pursuant to Article 94(3) EPC, dated Feb. 5, 2021 for European Application No. 16901513.8, filed on Nov. 4, 2016 (6 pages).
Ericsson, 3GPP TSG RAN WG1 Meeting #86bis, "LDPC Code Design for NR," R1-1608875, 13 pages, Lisbon, Portugal, Oct. 2016.
Extended European Search Report dated Apr. 29, 2019 for European Application No. 16901513.8, filed on Nov. 4, 2016 (12 pages).
Fossorier, M.P.C. "Quasi-Cyclic Low-Density Parity-Check Codes From Circulant Permutation Matrices," IEEE Transaction on Information Theory, vol. 50, No. 8, Aug. 1, 2004, pp. 1788-1793.
International Search Report and Written Opinion dated Feb. 6, 2017 for International Application No. PCT/CN2016/104744, filed on Nov. 4, 2016 (12 pages).
ZTE Corporation, et al., 3GPP TSG RAN WG1 Meeting #86, "Discussion on LDPC codes for NR," R1-166414, 11 pages, Gothenburg, Sweden, Aug. 2016.
Notification of the First Office Action for Chinese Application No. 2020105938428 dated Sep. 1, 2021, 5 pages.
Notification of the Second Office Action for Chinese Application No. 2020105938428 dated Feb. 14, 2022.
Notifications of Registration and Grant for Chinese Application No. 202010593842.8 dated Jan. 5, 2023, 2 pages.

\* cited by examiner

METHOD AND APPARATUS FOR DATA PROCESSING WITH STRUCTURED LDPC CODES

CROSS REFERENCE TO RELATED APPLICATIONS

This patent document is a continuation of and claims priority to U.S. patent application Ser. No. 16/730,962, filed on Dec. 30, 2019, which is a continuation of U.S. patent application Ser. No. 16/171,314, filed on Oct. 25, 2018, which is a continuation of International Patent Application No. PCT/CN2016/104744, filed on Nov. 4, 2016, which claims the benefit of priority to Chinese Patent Application No. 201610322409.4, filed on May 13, 2016, and Chinese Patent Application No. 201610879343.9, filed on Sep. 30, 2016. The entire contents of the before-mentioned patent applications are incorporated by reference as part of the disclosure of this document.

TECHNICAL FIELD

The present disclosure relates to communication technology, and more particularly, to a method and an apparatus for data processing with structured Low Density Parity Check (LDPC) codes.

BACKGROUND

A digital communication system typically includes three portions: a transmitter, a channel and a receiver. The transmitter can perform channel encoding on an information sequence to obtain encoded words, interleave the encoded words, map the interleaved bits onto modulated symbols, and then process and transmit the modulated symbols based on communication channel information. The channel may have a particular channel response due to various factors such as multipath and movements, which makes the data transmission distorted. Moreover, noises and interferences may further deteriorate the data transmission. The receiver receives the modulated symbol data that has passed through the channel. In this case, the modulated symbol data has been distorted and some processing will be required before the original information sequence can be restored.

In accordance with the coding scheme used for the information sequence at the transmitter, the receiver can perform corresponding processing on the received data, so as to restore the original information sequence reliably. The coding scheme needs to be visible to both the transmitter and the receiver. In general, the coding processing scheme is Forward Error Correction (FEC) based coding, which adds some redundant information to the information sequence. The receiver can utilize the redundant information to restore the original information sequence reliably.

Some common FEC coding schemes include convolutional coding, turbo coding and LDPC coding. In an FEC coding process, a k-bit information sequence is FEC encoded into n-bit FEC encoded words (with n-k redundant bits), with an FEC coding rate of k/n. The convolutional coding can easily encode blocks having any arbitrary sizes. In the turbo coding, different sizes of information sequences can be supported by utilizing two encoding components used for processing the information sequence and a code interleaving scheme capable of supporting different sizes.

The LDPC coding is linear block coding that can be defined using a very sparse parity check matrix or a bipartite graph. Low complexity of encoding/decoding is made possible with the sparsity of the check matrix, such that the LDPC can be applicable in practice. It has been proven by various practices and theories that the LDPC coding is the channel coding having the optimal performance in an Additive White Gaussian Noise (AWGN) channel. Its performance is very close to the Shannon limit and is superior to those of the convolutional coding and turbo coding.

In particular, structured LDPC codes have become a mainstream application due to its structured feature. They have been widely applied in e.g., IEEE 802.11ac, IEEE 802.11ad, IEEE 802.11aj, IEEE 802.16e, IEEE 802.11n, DVB, microwave communications and optical fiber communications. Such structured LDPC codes have a parity check matrix H having mb×z rows and nb×z columns. It is composed of mb×nb block matrices. The respective block matrices represent different powers of a z×z basic permutation matrix and are cyclically shifted matrices of the identity matrix. The matrix H has the following form:

$$H = \begin{bmatrix} P^{h^b_{00}} & P^{h^b_{01}} & P^{h^b_{02}} & \ldots & P^{h^b_{0n_b}} \\ P^{h^b_{10}} & P^{h^b_{11}} & P^{h^b_{12}} & \ldots & P^{h^b_{1n_b}} \\ \ldots & \ldots & \ldots & \ldots & \ldots \\ P^{h^b_{m_b0}} & P^{h^b_{m_b1}} & P^{h^b_{m_b2}} & \ldots & P^{h^b_{m_bn_b}} \end{bmatrix} = P^{H_b}$$

Let $h_{ij}^b = 1$, $P^{h_{ij}^b} = 0$, which is an all-zero matrix. If $h_{ij}^b$ is an integer larger than or equal to 0, let $P^{h_{ij}^b} = (P^{h_{ij}^b})$, where P is a z×z standard permutation matrix, as follows:

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

In this way, the exponent $h_{ij}^b$ can uniquely identify each block matrix. If a block matrix is an all-zero matrix, generally it can be represented as −1. If a block matrix is obtained by cyclically shifting the identity matrix by s, $h_{ij}^b$ equals to s. Thus, all '$h_{ij}^b$'s can constitute a basic check matrix Hb. z indicates the number of dimensions of the standard permutation matrix and is referred to as expansion factor herein. In this case, the structure LDPC codes can be uniquely determined from the basic check matrix Hb and the expansion factor z. The basic check matrix Hb has several parameters: mb, nb and kb, where mb is the number of rows of the basic check matrix (or the number of check columns of the basic check matrix), nb is the number of columns of the basic check matrix, and kb=nb−mb is the number of system columns of the basic check matrix.

For example, when a basic check matrix Hb (with 2 rows and 4 columns) is as follows and the expansion factor z equals to 4:

$$\begin{bmatrix} 0 & 1 & 0 & -1 \\ 2 & 1 & 2 & 1 \end{bmatrix},$$

the parity check matrix will be:

$$H = \begin{bmatrix} 1000 & 0001 & 1000 & 0000 \\ 0100 & 1000 & 0100 & 0000 \\ 0010 & 0100 & 0010 & 0000 \\ 0001 & 0010 & 0001 & 0000 \\ \hline 0010 & 0001 & 0010 & 0001 \\ 0001 & 1000 & 0001 & 1000 \\ 1000 & 0100 & 1000 & 0100 \\ 0100 & 0010 & 0100 & 0010 \end{bmatrix}.$$

Layered decoding, i.e., a partially parallel decoding scheme, can be applied to the LPDC codes. The above parity check matrix has 8 rows, which means there are 8 parity check codes. In decoding, each parity check matrix needs to be decoded individually. Data updates being completed for all the 8 parity check codes is referred to as one iteration. During each iteration, if the partially parallel (i.e., layered) decoding is utilized, e.g., with a degree of parallelism, p, meaning that p parity check codes are updated in parallel, the current and next p parity check codes will operate using the same updating module. In this case, the complexity of the decoder can be much lower. Moreover, in the layered decoding, the currently updated data can be used for updating the data at the next layer, which means a smaller number of iterations will be required and the decoding throughput will be higher. For the above H as an example, if the degree of parallelism is 2, then for every 4 rows of the parity check matrix (one row of the basic check matrix), two (the degree of parallelism) of the parity check codes will be updated in parallel.

In general, the parity check matrix could be very large and difficult to store and process. It would be much easier to store the basic check matrix.

According to fundamental mathematical knowledge, there are an infinite number of prime numbers. A prime number is a natural number greater than 1 that cannot be formed by multiplying two smaller natural numbers. Typically, a prime number is an integer larger than 1, e.g., 2, 3, 5, 7, 11, 13, 17, 19 and so on.

In almost all FEC coding methods, the encoder has a relatively low complexity and the complexity lies basically in the decoder at the receiver. The LDPC coding has a higher decoding speed and throughput as it has the parallelism feature such that the parallel decoding can be applied. However, typically the basic check matrix for the LDPC codes can only be adapted to particular lengths and it may not be easy to accommodate various, flexible lengths of code blocks. It will be more complicated to accommodate different lengths of code blocks.

There are currently no effective solutions to the problem in the related art associated with low flexibility in data sequence processing with LDPC coding.

SUMMARY

The embodiments of the present disclosure provide a method and an apparatus for data processing with structured LDPC codes, capable of solving the problem in the related art associated with low flexibility in data sequence processing with LDPC coding.

According to an embodiment of the present disclosure, a method for data processing with structured Low Density Parity Check (LDPC) codes is provided. The method includes: obtaining a code block size for structured LDPC coding; determining a coding expansion factor z based on at least one of the code block size, a parameter kb of a basic check matrix, a positive integer value p or the basic check matrix having mb rows and nb columns; and encoding a data sequence to be encoded, or decoding a data sequence to be decoded, based on the basic check matrix and the coding expansion factor, where kb=nb−mb and each of kb, p, mb, z and nb is an integer larger than 1.

Optionally, the operation of determining the coding expansion factor based at least on the code block size CBS, the parameter kb of the basic check matrix and the positive integer value p includes: determining the coding expansion factor in accordance with: $\lceil CBS/(kb \times p) \rceil \times p$, where $\lceil \ \rceil$ denotes a ceiling operation.

Optionally, the operation of obtaining the code block size for structured LDPC coding includes: the code block size being equal to a value obtained by multiplying the parameter kb of the basic check matrix with one of a set of natural numbers sorted in ascending order.

Optionally, the set of natural numbers sorted in ascending order includes a plurality of subsets each having an equal, first difference between neighboring elements.

Optionally, the first difference for the i-th subset in the set of natural numbers sorted in ascending order is smaller than the first difference for the (i+1)-th subset, where i is a positive integer.

Optionally, the operation of determining the coding expansion factor based on the code block size includes: the code block size being one of a set of code block sizes, the set of code block sizes being a first set of natural numbers stored in ascending order; and the coding expansion factor being one of a set of coding expansion factors, the set of coding expansion factors being a second set of natural numbers stored in ascending order.

Optionally, the set of code block sizes includes a number, a, of successive elements. When the first of the successive elements is larger than z(j)×kb and the last of the successive elements is smaller than or equal to z(j+1)×kb, the coding expansion factor corresponding to the successive elements is z(j+1), where a is a positive integer, z(j) is the j-th element of the set of coding expansion factors, j is a positive integer and kb is the parameter of the basic check matrix.

Optionally, the coding expansion factor is z(j+1) when the obtained code block size is one of the successive elements.

Optionally, the coding expansion factor is determined as z(j+1) when a ratio of the code block size to the parameter kb of the basic check matrix is larger than z(j) and smaller than or equal to z(j+1), where z(j) is the j-th element of the set of coding expansion factors.

Optionally, the set of coding expansion factors includes a plurality of subsets each having an equal, second difference between neighboring elements, and the second difference for the h-th subset of the plurality of subsets is smaller than the second difference for the (h+1)-th subset, where h is a positive integer.

Optionally, each of the elements in the set of coding expansion factors that is larger than the positive integer value p is n times the positive integer value p, where n is a positive integer.

Optionally, the set of code block sizes includes at least products of the parameter kb of the basic check matrix and respective ones of the set of coding expansion factors, and integers spaced by a positive integer B among all the products.

Optionally, the method further includes, prior to encoding the data sequence to be encoded based on the basic check matrix and the coding expansion factor: adding padding bits to a first data sequence by dividing the first data sequence into a plurality of data sub-sequences and adding padding bits to each of the plurality of data sub-sequences, such that all the data sub-sequences with the padding bits constitute the data sequence to be encoded.

Optionally, the method further includes, prior to encoding the data sequence to be encoded based on the basic check matrix and the coding expansion factor: adding padding bits to a second data sequence by dividing the second data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor.

Optionally, the method further includes, prior to adding the padding bits to the first or second data sequence: adding an L-bit Cyclic Redundancy Check (CRC) sequence to a third data sequence to obtain the first or second data sequence, where L is an integer larger than or equal to 0.

Optionally, the parameter kb of the basic check matrix is a difference between the number of columns of the basic check matrix and the number of rows of the basic check matrix, where kb is an integer larger than or equal to 4 and smaller than or equal to 64.

Optionally, the positive integer value p is a degree of parallelism of LDPC decoding.

Optionally, the positive integer value p is a fixed positive integer, and the degree p of parallelism of LDPC decoding includes: the positive integer value p being a positive integer power of 2 or a product of a positive integer power of 2 and a prime number.

Optionally, the positive integer value p is an element of a subset P, which is a subset of a set of all positive integer factors of Pmax, where Pmax is an integer larger than 3 and smaller than or equal to 1024.

Optionally, all values of the positive integer value p constitute a subset nSet, which is a subset of a set of positive integers, Ns, and has a length of F, where the set of positive integers Ns={1, 2, 3, . . . , M}, where M is an integer larger than 1.

Optionally, the subset nSet includes one of: a subset of the first F elements of the set of positive integers Ns, a subset of the last F elements of the set of positive integers Ns, a subset of F prime numbers in the set of positive integers Ns, a subset of F odd numbers in the set of positive integers Ns or a subset of F even numbers in the set of positive integers Ns, where F is a positive integer smaller than M.

Optionally, the coding expansion factor equals to a positive integer power of 2 minus 1, or a product of a positive integer power of 2 and a prime number. The prime number includes one of: 3, 5, 7, 11, 13, 17, 19, 23 or 29.

Optionally, the coding expansion factor equals to a product of a positive integer power of 2 and a prime number. The prime number includes one of 3 or 5.

Optionally, the coding expansion factor equals to a product of a positive integer power of 2 and a prime number. The prime number includes one of 5 or 7.

Optionally, the coding expansion factor equals to a product of a positive integer power of 2 and a prime number. The prime number includes one of 3, 5 or 7.

Optionally, the coding expansion factor includes one of: 7, 15, 31, 63, 127, 255, 511, 1023, 2047 or 4095.

Optionally, the method further includes, subsequent to determining the coding expansion factor z based on at least one of the code block size, the parameter kb of the basic check matrix, the positive integer value p or the basic check matrix: storing at least the basic check matrix.

Optionally, the method further includes, prior to encoding the data sequence to be encoded: adding k' dummy bits to the data sequence to be encoded, to obtain the data sequence to be encoded having a length of kb*z bits, where a ratio of k' to kb*z is smaller or equal to ¼, k' is an integer larger than or equal to 0, kb is a number of system columns of the basic check matrix and is an integer larger than 1, and z is the expansion factor to be used in the coding and is an integer larger than 0.

Optionally, the expansion factor z is n times a positive integer p1.

Optionally, the positive integer p1 is an element of a subset Pset, which is a subset of a set of all positive integer factors of Pmax, where n is a natural number and Pmax is an integer larger than or equal to 4.

Optionally, all values of the positive integer n constitute a subset nSet, which is a subset of a set of positive integers, Ns, and has a length of F, where the set of positive integers Ns={1, 2, 3, . . . , M}, where M is an integer larger than 1.

Optionally, the positive integer p1 is an element of a subset Pset, which is a subset composed of all values of the positive integer n, Kmax≤kb×p1max×nmax≤1.2×Kmax, where p1max is the largest value in the subset Pset, nmax is the largest value in the subset nSet, and Kmax is an integer larger than 1024.

Optionally, Kmax equals to 2000, 2048, 4000, 4096, 6000, 6144, 8000, 8192, 12000 or 12288.

Optionally, any element $hb_{ij}$ in the basic check matrix that indicates a non-all-zero square matrix satisfies mod(hbij, (Pmax/p1))=0, where i=0, 1, 2 . . . , mb−1, j=0, 1, . . . , nb−1, and Pmax is an integer larger than or equal to 4.

Optionally, any element $hb_{ij}$ in the basic check matrix that indicates a non-all-zero square matrix satisfies mod(hbij, (Pmax/p1))=A, where i is a row index of the basic check matrix, j is a column index of the basic check matrix, $hb_{ij}$ indicates a non-all-zero square matrix, A is a fixed integer smaller than p1 and larger than or equal to 0, and Pmax is an integer larger than or equal to 4.

Optionally, the parameter kb of the basic check matrix is a number of system columns of the basic check matrix.

According to another embodiment of the present disclosure, an apparatus for data processing with structured Low Density Parity Check (LDPC) codes is provided. The apparatus includes: an obtaining module configured to obtain a code block size for structured LDPC coding; a determining module configured to determine a coding expansion factor z based on at least one of the code block size, a parameter kb of a basic check matrix, a positive integer value p or the basic check matrix having mb rows and nb columns; and a processing module configured to encode a data sequence to be encoded, or decode a data sequence to be decoded, based on the basic check matrix and the coding expansion factor, where kb=nb-mb and each of kb, p, mb, z and nb is an integer larger than 1.

Optionally, the determining module is configured to: determine the coding expansion factor in accordance with ⌈CBS/(kb×p)⌉×p, where CBS is the code block size and ⌈ ⌉ denotes a ceiling operation.

Optionally, the obtaining module is configured such that the code block size is equal to a value obtained by multiplying the parameter kb of the basic check matrix with one of a set of natural numbers sorted in ascending order.

Optionally, the set of natural numbers sorted in ascending order includes a plurality of subsets each having an equal, first difference between neighboring elements.

Optionally, the first difference for the i-th subset in the set of natural numbers sorted in ascending order is smaller than the first difference for the (i+1)-th subset, where i is a positive integer.

Optionally, the determining module is configured such that: the code block size is one of a set of code block sizes, the set of code block sizes being a first set of natural numbers stored in ascending order; and the coding expansion factor is one of a set of coding expansion factors, the set of coding expansion factors being a second set of natural numbers stored in ascending order.

Optionally, the set of code block sizes includes a number, a, of successive elements. When the first of the successive elements is larger than $z(j) \times kb$ and the last of the successive elements is smaller than or equal to $z(j+1) \times kb$, the coding expansion factor corresponding to the successive elements is $z(j+1)$, where a is a positive integer, $z(j)$ is the j-th element of the set of coding expansion factors, j is a positive integer and kb is the parameter of the basic check matrix.

Optionally, the coding expansion factor is $z(j+1)$ when the obtained code block size is one of the successive elements.

Optionally, the coding expansion factor is determined as $z(j+1)$ when a ratio of the code block size to the parameter kb of the basic check matrix is larger than $z(j)$ and smaller than or equal to $z(j+1)$, where $z(j)$ is the j-th element of the set of coding expansion factors.

Optionally, the set of coding expansion factors includes a plurality of subsets each having an equal, second difference between neighboring elements, and the second difference for the h-th subset of the plurality of subsets is smaller than the second difference for the (h+1)-th subset, where h is a positive integer.

Optionally, each of the elements in the set of coding expansion factors that is larger than the positive integer value p is n times the positive integer value p, where n is a positive integer.

Optionally, the set of code block sizes includes at least products of the parameter kb of the basic check matrix and respective ones of the set of coding expansion factors, and integers spaced by a positive integer B among all the products.

Optionally, the apparatus further includes: a first bit padding module configured to add padding bits to a first data sequence by dividing the first data sequence into a plurality of data sub-sequences and adding padding bits to each of the plurality of data sub-sequences, such that all the data sub-sequences with the padding bits constitute the data sequence to be encoded.

Optionally, the apparatus further includes: a second bit padding module configured to add padding bits to a second data sequence by dividing the second data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor.

Optionally, the apparatus further includes: an adding module configured to add an L-bit Cyclic Redundancy Check (CRC) sequence to a third data sequence to obtain the first or second data sequence, where L is an integer larger than or equal to 0.

Optionally, the parameter kb of the basic check matrix is a difference between the number of columns of the basic check matrix and the number of rows of the basic check matrix, where kb is an integer larger than or equal to 4 and smaller than or equal to 64.

Optionally, the positive integer value p is a degree of parallelism of LDPC decoding.

Optionally, the positive integer value p is a fixed positive integer, and the degree p of parallelism of LDPC decoding includes: the positive integer value p being a positive integer power of 2 or a product of a positive integer power of 2 and a prime number.

Optionally, the positive integer value p is an element of a subset P, which is a subset of a set of all positive integer factors of Pmax, where Pmax is an integer larger than 3 and smaller than or equal to 1024.

Optionally, all values of the positive integer value p constitute a subset nSet, which is a subset of a set of positive integers, Ns, and has a length of F, where the set of positive integers $Ns=\{1, 2, 3, \ldots, M\}$, where M is an integer larger than 1.

Optionally, the subset nSet includes one of: a subset of the first F elements of the set of positive integers Ns, a subset of the last F elements of the set of positive integers Ns, a subset of F prime numbers in the set of positive integers Ns, a subset of F odd numbers in the set of positive integers Ns or a subset of F even numbers in the set of positive integers Ns, where F is a positive integer smaller than M.

Optionally, the coding expansion factor equals to a positive integer power of 2 minus 1, or a product of a positive integer power of 2 and a prime number. The prime number includes one of: 3, 5, 7, 11, 13, 17, 19, 23 or 29.

Optionally, the coding expansion factor equals to a product of a positive integer power of 2 and a prime number. The prime number includes one of 3 or 5.

Optionally, the coding expansion factor equals to a product of a positive integer power of 2 and a prime number. The prime number includes one of 5 or 7.

Optionally, the coding expansion factor equals to a product of a positive integer power of 2 and a prime number. The prime number includes one of 3, 5 or 7.

Optionally, the coding expansion factor includes one of: 7, 15, 31, 63, 127, 255, 511, 1023, 2047 or 4095.

Optionally, the apparatus further includes: a storage module configured to store at least the basic check matrix.

Optionally, the apparatus is further configured to, prior to encoding the data sequence to be encoded: add k' dummy bits to the data sequence to be encoded, to obtain the data sequence to be encoded having a length of kb*z bits, where a ratio of k' to kb*z is smaller or equal to ¼, k' is an integer larger than or equal to 0, kb is a number of system columns of the basic check matrix and is an integer larger than 1, and z is the expansion factor to be used in the coding and is an integer larger than 0.

Optionally, the expansion factor z is n times a positive integer p1.

Optionally, the positive integer p1 is an element of a subset Pset, which is a subset of a set of all positive integer factors of Pmax, where n is a natural number and Pmax is an integer larger than or equal to 4.

Optionally, all values of the positive integer n constitute a subset nSet, which is a subset of a set of positive integers, Ns, and has a length of F, where the set of positive integers $Ns=\{1, 2, 3, \ldots, M\}$, where M is an integer larger than 1.

Optionally, the positive integer p1 is an element of a subset Pset, which is a subset composed of all values of the positive integer n, $Kmax \leq kb \times p1max \times nmax \leq 1.2 \times Kmax$, where p1max is the largest value in the subset Pset, nmax is the largest value in the subset nSet, and Kmax is an integer larger than 1024.

Optionally, Kmax equals to 2000, 2048, 4000, 4096, 6000, 6144, 8000, 8192, 12000 or 12288.

Optionally, any element $hb_{ij}$ in the basic check matrix that indicates a non-all-zero square matrix satisfies mod(hbij, (Pmax/pl))=0, where i=0, 1, 2 . . . , mb−1, j=0, 1, . . . , nb−1, and Pmax is an integer larger than or equal to 4.

Optionally, any element $hb_{ij}$ in the basic check matrix that indicates a non-all-zero square matrix satisfies mod(hbij, (Pmax/pl))=A, where i is a row index of the basic check matrix, j is a column index of the basic check matrix, $hb_{ij}$ indicates a non-all-zero square matrix, A is a fixed integer smaller than pl and larger than or equal to 0, and Pmax is an integer larger than or equal to 4.

Optionally, the parameter kb of the basic check matrix is a number of system columns of the basic check matrix.

With the present disclosure, a code block size for structured LDPC coding is obtained. A coding expansion factor z is determined based on at least one of the code block size, a parameter kb of a basic check matrix, a positive integer value p or the basic check matrix having mb rows and nb columns. A data sequence to be encoded is encoded, or a data sequence to be decoded is decoded, based on the basic check matrix and the coding expansion factor. Here, kb=nb-mb and each of kb, p, mb, z and nb is an integer larger than 1. It can be seen that, with the above solution, the coding expansion factor is determined based on at least one of the code block size, the parameter kb of the basic check matrix, the positive integer value p or the basic check matrix having mb rows and nb columns. The LDPC encoding and decoding are performed based on the basic check matrix and the coding expansion factor. In this way, the flexibility in data processing with LDPC coding can be improved, thereby solving the problem in the related art associated with low flexibility in data processing with LDPC coding.

BRIEF DESCRIPTION OF THE DRAWINGS

The present disclosure can be further understood with reference to the figures described below, which constitute a part of the present disclosure. The illustrative embodiments of the present disclosure and descriptions thereof are provided for explaining, rather than limiting, the present disclosure. In the figures:

FIG. 6 is a schematic diagram showing a basic check matrix according to an optional embodiment of the present disclosure.

Figures 7, 8:
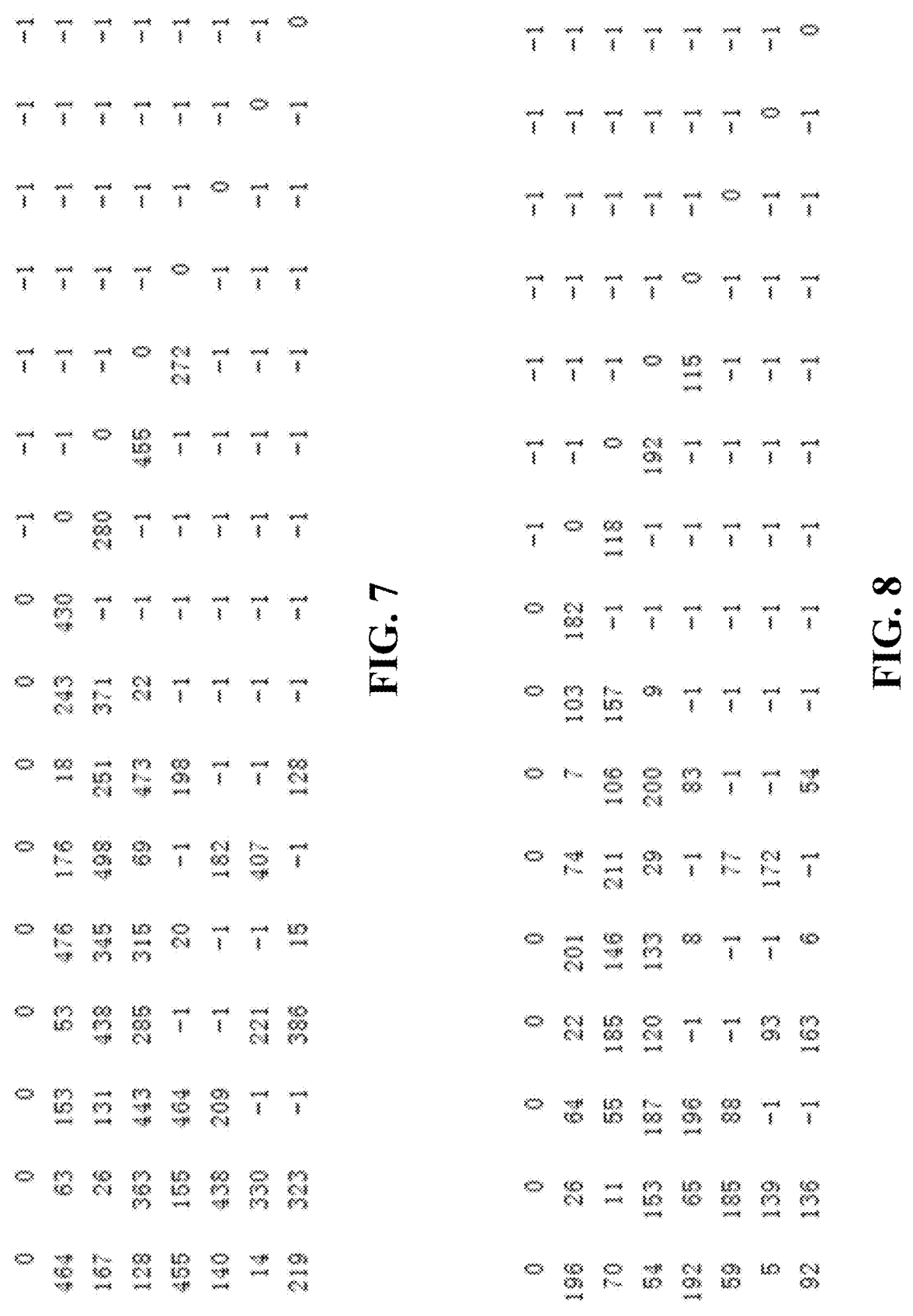

FIG. 7 is a first schematic diagram showing a basic check matrix Hb' according to an optional embodiment of the present disclosure.

FIG. 8 is a second schematic diagram showing a basic check matrix Hb' according to an optional embodiment of the present disclosure.

DETAILED DESCRIPTION OF THE EMBODIMENTS

In the following, the present disclosure will be described in detail with reference to the figures, taken in conjunction with the embodiments. The embodiments, and the features thereof, can be combined with each other, provided that they do not conflict.

It is to be noted that, the terms such as "first", "second" and so on in the description, claims and figures are used for distinguishing among similar objects and do not necessarily imply any particularly order or sequence.

Embodiment 1

Figure 1:
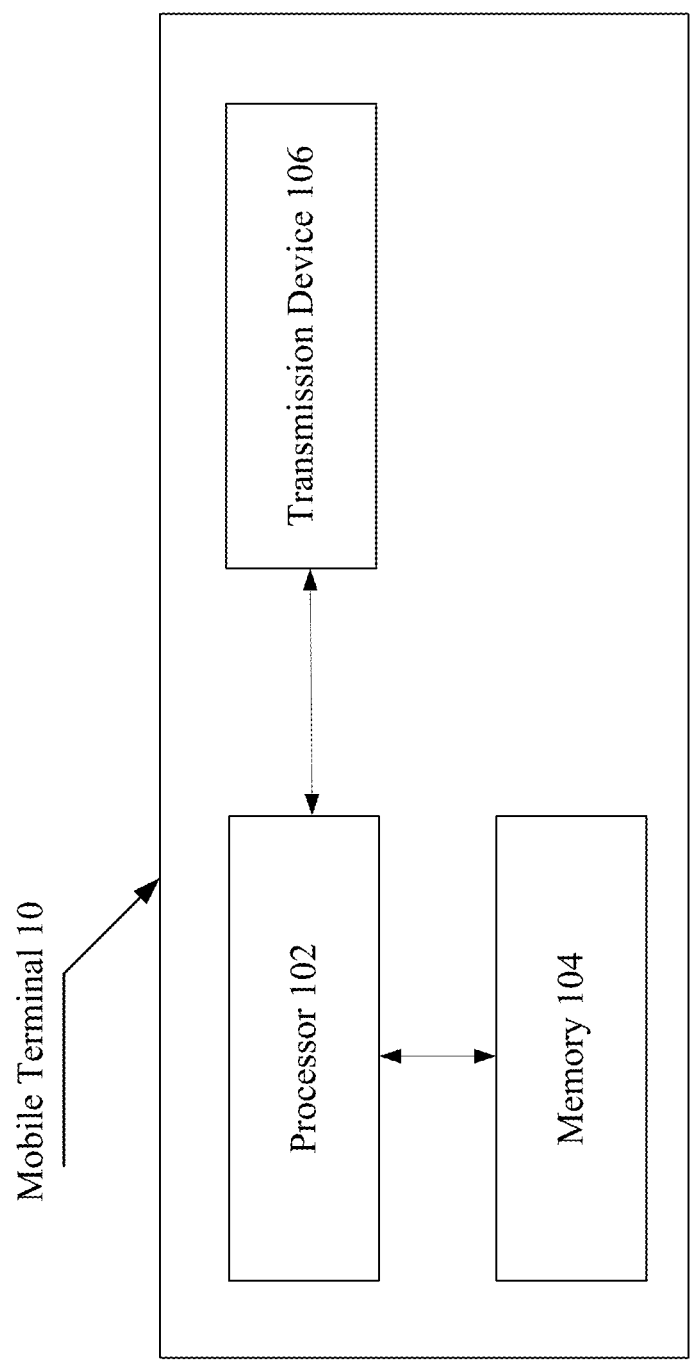
FIG. 1 is a block diagram showing a hardware structure of a mobile terminal in which a method for data processing with structured LDPC codes can be applied according to an embodiment of the present disclosure.

The method according to Embodiment 1 of the present disclosure can be performed in a mobile terminal, a computer terminal or a similar computing device. When the method is performed in a mobile terminal for example, FIG. 1 is a block diagram showing a hardware structure of a mobile terminal in which a method for data processing with LDPC codes can be applied according to an embodiment of the present disclosure. As shown in FIG. 1, the mobile terminal 10 can include: one or more processors 102 (only one is shown, including, but not limited to, a processing device such as a microprocessor or a Micro Control Unit (MCU) or a programmable logic device such as Field Programmable Gate Array (FPGA)), a memory 104 for storing data, and a transmission device 106 for providing communication functions. It can be appreciated by those skilled in the art that the structure shown in FIG. 1 is illustrative only, and the structure of the above electronic device is not limited thereto. For example, the mobile terminal 10 may include more or less components than those shown in FIG. 1, or have a different configuration from the one shown in FIG. 1.

The memory 104 can store software programs and modules of software applications, e.g., program instructions/modules associated with the method for carrier phase recovery according to an embodiment of the present disclosure. The processor 102 performs various functional applications and data processing operations, i.e., performing the above method, by executing the software programs and modules stored in the memory 104. The memory 104 may include a random cache or a non-volatile memory such as one or more magnetic storage devices, flash memories or other non-volatile solid-state memories. In some examples, the memory 104 may further include one or more memories provided remotely from the processor 102, which can be connected to the mobile terminal 10 via a network. Examples of such network include, but are not limited to, Internet, an intranet of an enterprise, a Local Area Network (LAN), a mobile communication network, or any combination thereof.

The transmission device 106 can transmit or receive data via a network. The network can be e.g., a wireless network provided by a communication provider of the mobile terminal 10. In an example, the transmission device 106 includes a Network Interface Controller (NIC), which can be connected to other network devices via a base station for communication with Internet. In an example, the transmission device 106 can be a Radio Frequency (RF) module for communicating with Internet wirelessly.

Figure 2:
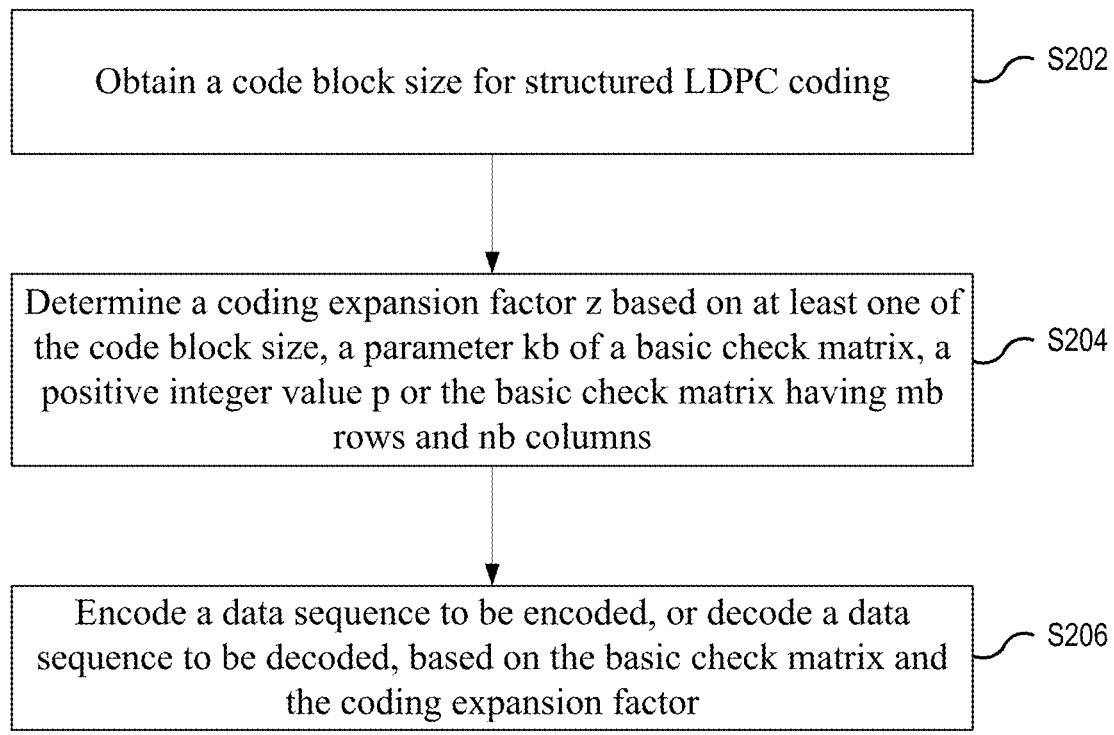
FIG. 2 is a flowchart illustrating a method for data processing with structured LDPC codes according to an embodiment of the present disclosure.

In this embodiment, a method for data processing with structured LDPC codes is provided. FIG. 2 is a flowchart illustrating a method for data processing with structured LDPC codes according to an embodiment of the present disclosure. As shown in FIG. 2, the method includes the following steps.

At step S202, a code block size for structured LDPC coding is obtained.

At step S204, a coding expansion factor z is determined based on at least one of the code block size, a parameter kb of a basic check matrix, a positive integer value p or the basic check matrix having mb rows and nb columns.

At step S206, a data sequence to be encoded is encoded, or a data sequence to be decoded is decoded, based on the basic check matrix and the coding expansion factor.

Here, kb=nb−mb and each of kb, p, mb, z and nb is an integer larger than 1.

Optionally, the above method for data processing with structured LDPC codes can, but not limited to, be applied in data sequence processing scenarios, e.g., a scenario in which a data sequence is processed with LDPC encoding or decoding.

Optionally, the above method for data processing with structured LDPC codes can, but not limited to, be applied in an LDPC encoder or an LDPC decoder, e.g., a transmitter with LDPC encoding or a receiver with LDPC decoding.

With the above steps, a code block size for structured LDPC coding is obtained. A coding expansion factor z is determined based on at least one of the code block size, a parameter kb of a basic check matrix or a positive integer value p. A data sequence to be encoded is encoded, or a data sequence to be decoded is decoded, based on the basic check matrix and the coding expansion factor. It can be seen that, with the above solution, the coding expansion factor is determined based on at least one of the code block size, the parameter kb of the basic check matrix or the positive integer value p. The LDPC encoding and decoding are performed based on the basic check matrix and the coding expansion factor. In this way, the flexibility in data processing with LDPC coding can be improved, thereby solving the problem in the related art associated with low flexibility in data processing with LDPC coding. Further, LDPC encoding and decoding can be applied effectively to different code block sizes, such that the complexity of the LDPC coding can be reduced.

Optionally, as a non-limiting example, the coding expansion factor can be determined in accordance with: $\lceil CBS/(kb \times p) \rceil \times p$, where CBS is the code block size and $\lceil \ \rceil$ denotes a ceiling operation.

Optionally, in the above step S202, the code block size is equal to a value obtained by multiplying the parameter kb of the basic check matrix with one of a set of natural numbers sorted in ascending order.

Optionally, as a non-limiting example, the set of natural numbers sorted in ascending order can include a plurality of subsets each having an equal, first difference between neighboring elements.

Optionally, the first difference for the i-th subset in the set of natural numbers sorted in ascending order is smaller than the first difference for the (i+1)-th subset, where i is a positive integer.

Optionally, as a non-limiting example, in the above step S206, the operation of determining the coding expansion factor based on the code block size can include: the code block size being one of a set of code block sizes, the set of code block sizes being a first set of natural numbers stored in ascending order; and the coding expansion factor being one of a set of coding expansion factors, the set of coding expansion factors being a second set of natural numbers stored in ascending order.

Optionally, the set of code block sizes includes a number, a, of successive elements. When the first of the successive elements is larger than $z(j) \times kb$ and the last of the successive elements is smaller than or equal to $z(j+1) \times kb$, the coding expansion factor corresponding to the successive elements is $z(j+1)$, where a is a positive integer, $z(j)$ is the j-th element of the set of coding expansion factors, j is a positive integer and kb is the parameter of the basic check matrix.

Optionally, as a non-limiting example, the coding expansion factor can be $z(j+1)$ when the obtained code block size is one of the successive elements.

Optionally, the coding expansion factor is determined as $z(j+1)$ when a ratio of the code block size to the parameter kb of the basic check matrix is larger than $z(j)$ and smaller than or equal to $z(j+1)$, where $z(j)$ is the j-th element of the set of coding expansion factors.

Optionally, as a non-limiting example, the set of coding expansion factors can include a plurality of subsets each having an equal, second difference between neighboring elements, and the second difference for the h-th subset of the plurality of subsets is smaller than the second difference for the (h+1)-th subset, where h is a positive integer.

Optionally, each of the elements in the set of coding expansion factors that is larger than the positive integer value p is n times the positive integer value p, where n is a positive integer.

Optionally, as a non-limiting example, the set of code block sizes can include at least products of the parameter kb of the basic check matrix and respective ones of the set of coding expansion factors, and integers spaced by a positive integer B among all the products.

Optionally, as a non-limiting example, before the above step S206, padding bits can be added to a first data sequence by dividing the first data sequence into a plurality of data sub-sequences and adding padding bits to each of the plurality of data sub-sequences, such that all the data sub-sequences with the padding bits constitute the data sequence to be encoded.

Optionally, as a non-limiting example, before the above step S206, padding bits can be added to a second data sequence by dividing the second data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor.

Optionally, as a non-limiting example, prior to adding the padding bits to the first or second data sequence, an L-bit Cyclic Redundancy Check (CRC) sequence can be added to a third data sequence to obtain the first or second data sequence, where L is an integer larger than or equal to 0.

Optionally, the parameter kb of the basic check matrix is a difference between the number of columns of the basic check matrix and the number of rows of the basic check matrix, where kb is an integer larger than or equal to 4 and smaller than or equal to 64.

Optionally, the positive integer value p is a degree of parallelism of LDPC decoding.

Optionally, the positive integer value p is a fixed positive integer, and the degree p of parallelism of LDPC decoding includes: the positive integer value p being a positive integer power of 2 or a product of a positive integer power of 2 and a prime number.

Optionally, the positive integer value p is an element of a subset P, which is a subset of a set of all positive integer factors of Pmax, where Pmax is an integer larger than 3 and smaller than or equal to 1024.

Optionally, all values of the positive integer value p constitute a subset nSet, which is a subset of a set of positive integers, Ns, and has a length of F, where the set of positive integers Ns={1, 2, 3, ..., M}, where M is an integer larger than 1.

Optionally, the subset nSet includes one of: a subset of the first F elements of the set of positive integers Ns, a subset of the last F elements of the set of positive integers Ns, a subset of F prime numbers in the set of positive integers Ns, a subset of F odd numbers in the set of positive integers Ns or a subset of F even numbers in the set of positive integers Ns, where F is a positive integer smaller than M.

Optionally, as a non-limiting example, the coding expansion factor can equal to a positive integer power of 2 minus 1, or a product of a positive integer power of 2 and a prime number, and the prime number includes one of: 3, 5, 7, 11, 13, 17, 19, 23 or 29. Optionally, the coding expansion factor equals to a product of a positive integer power of 2 and a prime number, and the prime number includes one of 3 or 5. Optionally, the coding expansion factor equals to a product of a positive integer power of 2 and a prime number, and the prime number includes one of 5 or 7. Optionally, the coding expansion factor equals to a product of a positive integer power of 2 and a prime number, and the prime number includes one of 3, 5 or 7.

Optionally, the coding expansion factor includes one of: 7, 15, 31, 63, 127, 255, 511, 1023, 2047 or 4095.

Optionally, after the above step S204, the basic check matrix can be stored.

Optionally, before encoding the data sequence to be encoded, k' dummy bits can be added to the data sequence to be encoded, to obtain the data sequence to be encoded having a length of kb*z bits, where a ratio of k' to kb*z is smaller or equal to ¼, k' is an integer larger than or equal to 0, kb is a number of system columns of the basic check matrix and is an integer larger than 1, and z is the expansion factor to be used in the coding and is an integer larger than 0. In the LDPC encoding, the basic check matrix of LDPC codes has a certain degree distribution characteristic, which may be damaged if too many padding bits are added, resulting in a degraded decoding performance of the LDPC codes. By limiting the padding length within ¼, it is advantageous in that the fundamental characteristics of the basic check matrix of the LDPC codes, and thus the decoding performance of the LDPC codes, may remain substantially the same. Here, the number and position of the padding bits are known to both the transmitter and receiver. The padding bits are not included in the data transmission. During the decoding of the LDPC codes, these known bits will not affect the decoding result. If all bits in a particular column of the basic check matrix are padding bits, this column should be deleted from the basic check matrix and in this case the degree distribution of the basic check matrix will be changed.

Optionally, the expansion factor z is n times a positive integer pl.

Optionally, the positive integer pl is an element of a subset Pset, which is a subset of a set of all positive integer factors of Pmax, where n is a natural number and Pmax is an integer larger than or equal to 4.

Optionally, all values of the positive integer n constitute a subset nSet, which is a subset of a set of positive integers, Ns, and has a length of F, where the set of positive integers Ns={1, 2, 3, ..., M}, where M is an integer larger than 1.

Optionally, any element $hb_{ij}$ in the basic check matrix that indicates a non-all-zero square matrix satisfies mod(hbij, (Pmax/pl))=0, where i=0, 1, 2 ..., mb−1, j=0, 1, ..., nb−1, and Pmax is an integer larger than or equal to 4.

Optionally, any element $hb_{ij}$ in the basic check matrix that indicates a non-all-zero square matrix satisfies mod(hbij, (Pmax/pl))=A, where i is a row index of the basic check matrix, j is a column index of the basic check matrix, $hb_{ij}$ indicates a non-all-zero square matrix, A is a fixed integer smaller than pl and larger than or equal to 0, and Pmax is an integer larger than or equal to 4.

Optionally, the parameter kb of the basic check matrix is a number of system columns of the basic check matrix.

Embodiment 2

According to an embodiment of the present disclosure, an apparatus for data processing with structured LDPC codes is also provided. The apparatus can implement the above embodiments and optional embodiments (details thereof will be omitted here). As used hereinafter, the term "module" can be software, hardware, or a combination thereof, capable of performing a predetermined function. While the apparatuses to be described in the following embodiments are preferably implemented in software, it can be contemplated that they can also be implemented in hardware or a combination of software and hardware.

Figure 3:
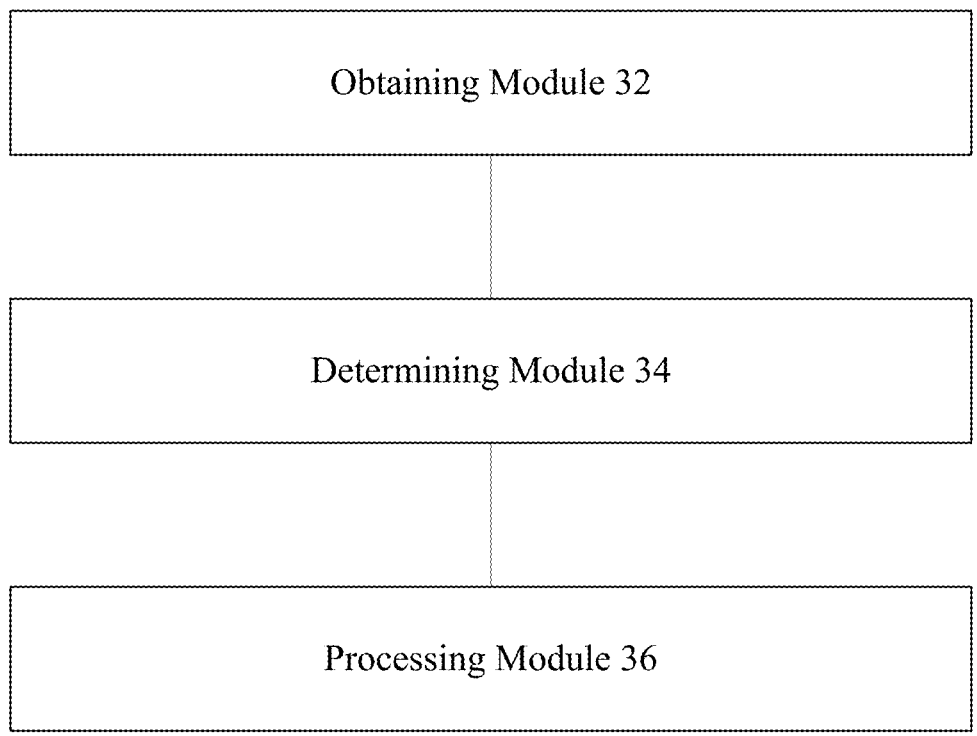
FIG. 3 is a first block diagram of an apparatus for data processing with structured LDPC codes according to an embodiment of the present disclosure.

FIG. 3 is a first block diagram of an apparatus for data processing with structured LDPC codes according to an embodiment of the present disclosure. As shown in FIG. 3, the apparatus includes:

1) an obtaining module 32 configured to obtain a code block size for structured LDPC coding;

2) a determining module 34 coupled to the obtaining module 32 and configured to determine a coding expansion factor z based on at least one of the code block size, a parameter kb of a basic check matrix or a positive integer value p; and 3) a processing module 36 coupled to the determining module 34 and configured to encode a data sequence to be encoded, or decode a data sequence to be decoded, based on the basic check matrix and the coding expansion factor, where kb=nb−mb and each of kb, p, mb, z and nb is an integer larger than 1.

Optionally, the above apparatus for data processing with structured LDPC codes can, but not limited to, be applied in data sequence processing scenarios, e.g., a scenario in which a data sequence is processed with LDPC encoding or decoding.

Optionally, the above apparatus for data processing with structured LDPC codes can, but not limited to, be applied in an LDPC encoder or an LDPC decoder, e.g., a transmitter with LDPC encoding or a receiver with LDPC decoding.

With the above apparatus, an obtaining module obtains a code block size for structured LDPC coding. A determining module determines a coding expansion factor z based on at least one of the code block size, a parameter kb of a basic check matrix, a positive integer value p or the basic check matrix having mb rows and nb columns. A processing module encodes a data sequence to be encoded, or decodes a data sequence to be decoded, based on the basic check matrix and the coding expansion factor. Here, kb=nb−mb and each of kb, p, mb, z and nb is an integer larger than 1. It can be seen that, with the above solution, the coding expansion factor is determined based on at least one of the code block size, the parameter kb of the basic check matrix or the positive integer value p. The LDPC encoding and decoding are performed based on the basic check matrix and the coding expansion factor. In this way, the flexibility in data processing with LDPC coding can be improved, thereby solving the problem in the related art associated with low flexibility in data processing with LDPC coding. Further, LDPC encoding and decoding can be applied effectively to different code block sizes, such that the complexity of the LDPC coding can be reduced.

Optionally, as a non-limiting example, the determining module can be configured to: determine the coding expansion factor in accordance with $\lceil CBS/(kb \times p) \rceil \times p$, where CBS is the code block size and $\lceil \ \rceil$ denotes a ceiling operation.

Optionally, as a non-limiting example, the obtaining module can be configured such that the code block size is equal to a value obtained by multiplying the parameter kb of the basic check matrix with one of a set of natural numbers sorted in ascending order.

Optionally, as a non-limiting example, the set of natural numbers sorted in ascending order can include a plurality of subsets each having an equal, first difference between neighboring elements.

Optionally, the first difference for the i-th subset in the set of natural numbers sorted in ascending order is smaller than the first difference for the (i+1)-th subset, where i is a positive integer.

Optionally, the determining module is configured such that: the code block size is one of a set of code block sizes, the set of code block sizes being a first set of natural numbers stored in ascending order; and the coding expansion factor is one of a set of coding expansion factors, the set of coding expansion factors being a second set of natural numbers stored in ascending order.

Optionally, the set of code block sizes includes a number, a, of successive elements. When the first of the successive elements is larger than $z(j) \times kb$ and the last of the successive elements is smaller than or equal to $z(j+1) \times kb$, the coding expansion factor corresponding to the successive elements is $z(j+1)$, where a is a positive integer, $z(j)$ is the j-th element of the set of coding expansion factors, j is a positive integer and kb is the parameter of the basic check matrix.

Optionally, the coding expansion factor is $z(j+1)$ when the obtained code block size is one of the successive elements.

Optionally, the coding expansion factor is determined as $z(j+1)$ when a ratio of the code block size to the parameter kb of the basic check matrix is larger than $z(j)$ and smaller than or equal to $z(j+1)$, where $z(j)$ is the j-th element of the set of coding expansion factors.

Optionally, the set of coding expansion factors includes a plurality of subsets each having an equal, second difference between neighboring elements, and the second difference for the h-th subset of the plurality of subsets is smaller than the second difference for the (h+1)-th subset, where h is a positive integer.

Optionally, each of the elements in the set of coding expansion factors that is larger than the positive integer value p is n times the positive integer value p, where n is a positive integer.

Optionally, the set of code block sizes includes at least products of the parameter kb of the basic check matrix and respective ones of the set of coding expansion factors, and integers spaced by a positive integer B among all the products.

Figure 4:
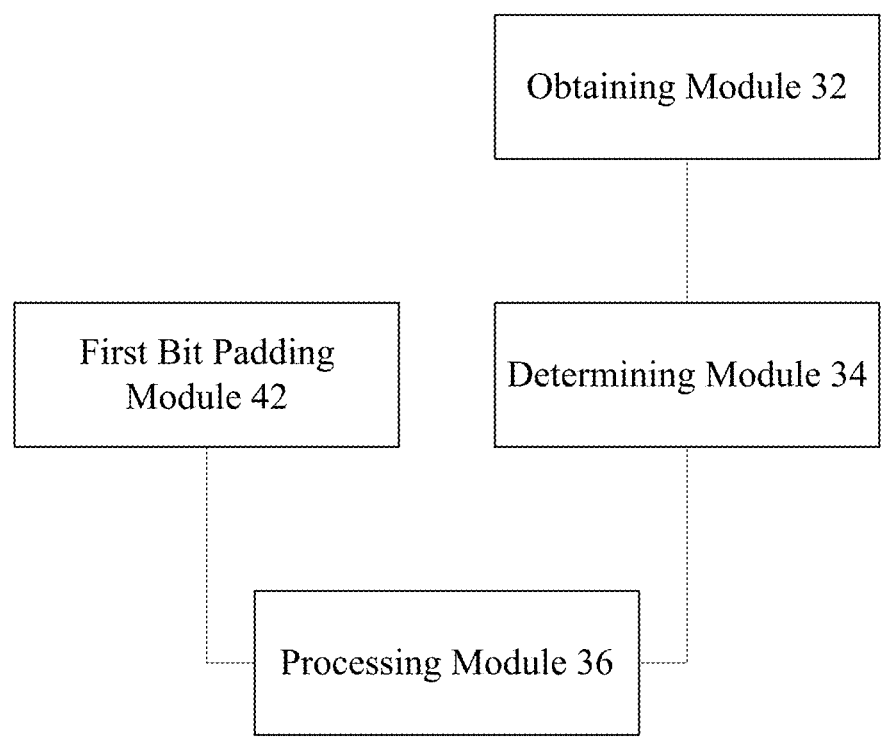
FIG. 4 is a second block diagram of an apparatus for data processing with structured LDPC codes according to an embodiment of the present disclosure.

FIG. 4 is a second block diagram of an apparatus for data processing with structured LDPC codes according to an embodiment of the present disclosure. As shown in FIG. 4, optionally, the apparatus further includes: a first bit padding module 42 coupled to the processing module 36 and configured to add padding bits to a first data sequence by dividing the first data sequence into a plurality of data sub-sequences and adding padding bits to each of the plurality of data sub-sequences, such that all the data sub-sequences with the padding bits constitute the data sequence to be encoded.

Figure 5:
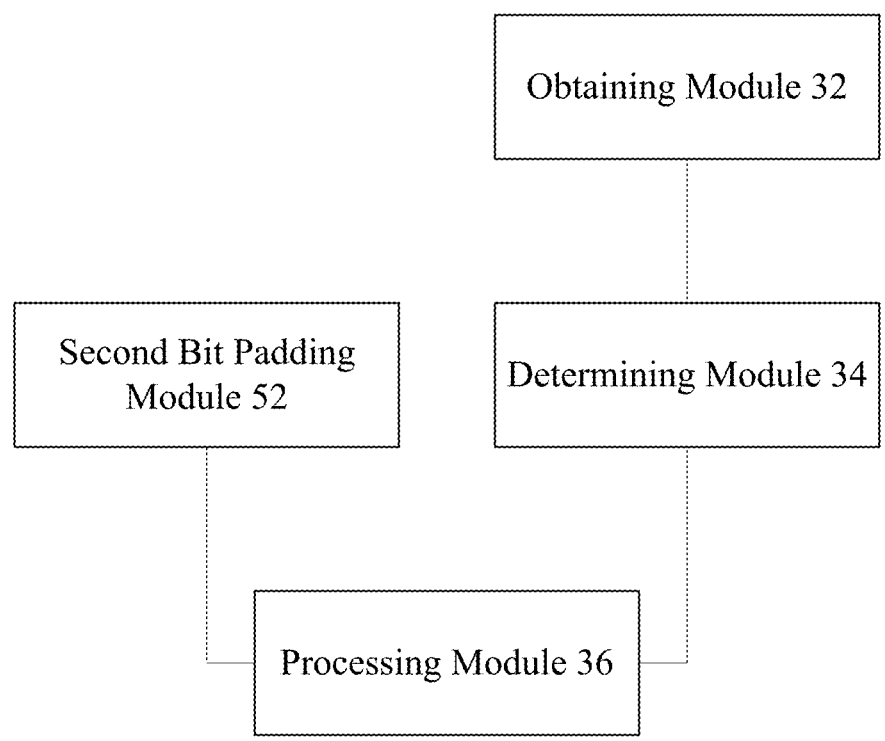
FIG. 5 is a third block diagram of an apparatus for data processing with structured LDPC codes according to an embodiment of the present disclosure.

FIG. 5 is a third block diagram of an apparatus for data processing with structured LDPC codes according to an embodiment of the present disclosure. As shown in FIG. 5, optionally, the apparatus further includes: a second bit padding module 52 coupled to the processing module 36 and configured to add padding bits to a second data sequence by dividing the second data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor.

Optionally, the apparatus further includes: an adding module coupled to the first bit padding module 42 or the second bit padding module 52 and configured to add an L-bit Cyclic Redundancy Check (CRC) sequence to a third data sequence to obtain the first or second data sequence, where L is an integer larger than or equal to 0.

Optionally, the parameter kb of the basic check matrix is a difference between the number of columns of the basic check matrix and the number of rows of the basic check matrix, where kb is an integer larger than or equal to 4 and smaller than or equal to 64.

Optionally, as a non-limiting example, the positive integer value p can be a degree of parallelism of LDPC decoding.

Optionally, the positive integer value p is a fixed positive integer, and the degree p of parallelism of LDPC decoding includes: the positive integer value p being a positive integer power of 2 or a product of a positive integer power of 2 and a prime number.

Optionally, the positive integer value p is an element of a subset P, which is a subset of a set of all positive integer factors of Pmax, where Pmax is an integer larger than 3 and smaller than or equal to 1024.

Optionally, all values of the positive integer value p constitute a subset nSet, which is a subset of a set of positive integers, Ns, and has a length of F, where the set of positive integers Ns={1, 2, 3, . . . , M}, where M is an integer larger than 1.

Optionally, the subset nSet includes one of: a subset of the first F elements of the set of positive integers Ns, a subset of the last F elements of the set of positive integers Ns, a subset of F prime numbers in the set of positive integers Ns, a subset of F odd numbers in the set of positive integers Ns or a subset of F even numbers in the set of positive integers Ns, where F is a positive integer smaller than M.

It is to be noted here that the first case in which the positive integer value p is a positive integer power of 2 and the second case in which the positive integer value p is a product of a positive integer power of 2 and a prime number are mutual exclusive. If the prime number is 2, the first case and the second case are the same, which is unreasonable.

Hence, the case in which the prime number is 2 is considered to be the first case. Further, in this context, the first case includes a power of 1*2, but 1 is not a prime number. Thus, the prime number here is at least larger than or equal to 3.

Optionally, the coding expansion factor equals to a positive integer power of 2 minus 1, or a product of a positive integer power of 2 and a prime number, and the prime number includes one of: 3, 5, 7, 11, 13, 17, 19, 23 or 29. Optionally, the coding expansion factor equals to a product of a positive integer power of 2 and a prime number, and the prime number includes one of 3 or 5. Optionally, the coding expansion factor equals to a product of a positive integer power of 2 and a prime number, and the prime number includes one of 5 or 7. Optionally, the coding expansion factor equals to a product of a positive integer power of 2 and a prime number, and the prime number includes one of 3, 5 or 7.

Optionally, the coding expansion factor includes one of: 7, 15, 31, 63, 127, 255, 511, 1023, 2047 or 4095.

Optionally, the apparatus further includes: a storage module configured to store at least the basic check matrix.

Optionally, the apparatus is further configured to, prior to encoding the data sequence to be encoded: add k' dummy bits to the data sequence to be encoded, to obtain the data sequence to be encoded having a length of kb*z bits, where a ratio of k' to kb*z is smaller or equal to ¼, k' is an integer larger than or equal to 0, kb is a number of system columns of the basic check matrix and is an integer larger than 1, and z is the expansion factor to be used in the coding and is an integer larger than 0.

Optionally, the expansion factor z is n times a positive integer pl.

Optionally, the positive integer pl is an element of a subset Pset, which is a subset of a set of all positive integer factors of Pmax, where n is a natural number and Pmax is an integer larger than or equal to 4.

Optionally, all values of the positive integer n constitute a subset nSet, which is a subset of a set of positive integers, Ns, and has a length of F, where the set of positive integers Ns={1, 2, 3, . . . , M}, where M is an integer larger than 1.

Optionally, any element $hb_{ij}$ in the basic check matrix that indicates a non-all-zero square matrix satisfies mod(hbij, (Pmax/pl))=0, where i=0, 1, 2 . . . , mb−1, j=0, 1, . . . , nb−1, and Pmax is an integer larger than or equal to 4.

Optionally, any element $hb_{ij}$ in the basic check matrix that indicates a non-all-zero square matrix satisfies mod(hbij, (Pmax/pl))=A, where i is a row index of the basic check matrix, j is a column index of the basic check matrix, $hb_{ij}$ indicates a non-all-zero square matrix, A is a fixed integer smaller than pl and larger than or equal to 0, and Pmax is an integer larger than or equal to 4.

Optionally, the parameter kb of the basic check matrix is a number of system columns of the basic check matrix.

It should be noted that each of the above-described modules can be implemented by means of software or hardware, and the latter can be implemented in, but not limited to, the following manner: the above-mentioned modules can be located at the same processor, or can be distributed over a plurality of processors.

In the following, the optional embodiments of the present disclosure will be described in detail.

In an optional embodiment of the present disclosure, a method for LDPC encoding/decoding is provided. The method includes the following steps.

At step 101, a code block size for structured LDPC coding is obtained.

At step 102, a coding expansion factor z is determined based on at least one of the code block size, a parameter kb of a basic check matrix, a positive integer value p or the basic check matrix.

At step 103, a data sequence to be encoded is encoded, or a data sequence to be decoded is decoded, based on the basic check matrix and the coding expansion factor.

Optionally, the operation of determining the coding expansion factor based at least on the code block size CBS, the parameter kb of the basic check matrix and the positive integer value p includes: the coding expansion factor being equal to ⌈CBS/(kb×p)⌉×p, where CBS is the code block size. In an actual layered LDPC decoding process, the positive integer value p corresponds to a degree of parallelism of LDPC decoding or a multiple thereof. In this case, the coding expansion factor is dependent on the degree of parallelism, which is advantageous in that the hardware implementation for the layered LDPC decoding can be simple, without any mismatch between interleaving and de-interleaving in the decoder.

Optionally, the code block size can be equal to a value obtained by multiplying the parameter kb of the basic check matrix with one of a set of natural numbers sorted in ascending order.

Optionally, the parameter kb of the basic check matrix is a difference between the number of columns of the basic check matrix and the number of rows of the basic check matrix, where kb is an integer larger ranging from 4 to 64. The set of natural numbers sorted in ascending order includes a plurality of subsets each having an equal difference within the subset. Optionally, in the set of natural numbers sorted in ascending order, the difference for the i-th subset is smaller than the difference for the (i+1)-th subset, where i is a positive integer.

Optionally, the code block size is one of a set of code block sizes. The set of code block sizes is a set of natural numbers stored in ascending order. The coding expansion factor is one of a set of coding expansion factors. The set of coding expansion factors is a set of natural numbers stored in ascending order.

Optionally, the set of code block sizes includes a number, a, of successive elements. When the first of the successive elements is larger than z(j)×kb and the last of the successive elements is smaller than or equal to z(j+1)×kb, the coding expansion factor corresponding to the successive elements is z(j+1), where a is a positive integer and z(j) is the j-th element of the set of coding expansion factors. When the code block size is one of the successive elements, the coding expansion factor is limited to z(j+1).

Optionally, the set of coding expansion factors includes a plurality of subsets each having an equal difference within the subset. The difference for the h-th subset of the plurality of subsets is smaller than the difference for the (h+1)-th subset, where h is a positive integer. The set of code block sizes includes at least products of the parameter kb of the basic check matrix and respective ones of the set of coding expansion factors, and integers spaced by a positive integer B among all the products. The products of the parameter kb of the basic check matrix and respective ones of the set of coding expansion factors are numbers of maximum system bits that can be supported by LDPC codes for different coding expansion factors. There may also be code block sizes among the respective numbers of system bits, such that the code block sizes can be more flexible to be used in various communication systems. The problem associated with lack of flexibility in code lengths and code rates of LDPC codes can be solved.

Optionally, the coding expansion factor may equal to a positive integer power of 2 minus 1. More particularly, the coding expansion factor can include one of: 7, 15, 31, 63, 127, 255, 511, 1023, 2047 or 4095. This is advantageous in that each subset of z bits in the LDPC codes includes a corresponding number of CRC bits. Owing to the characteristic of the CRC cyclic code that a CRC cyclic code shifted cyclically by any arbitrary number of bits still belongs to a CRC cyclic codeword space (i.e., it is still a CRC cyclic code), each subset of z bits in the check bits for the LDPC codes is still a CRC cyclic code and can thus still be used for CRC check. This facilitates improving the decoding performance of the LDPC codes and accelerating decoding convergence in an iterative decoding process, which can reduce the decoding time and improve the decoding speed (z equals to the value of the expansion factor). Alternatively, the coding expansion factor may equal to a product of a positive integer power of 2 and a prime number. More particularly, the prime number can be e.g., one of 3, 5, 7, 11, 13, 17, 19, 23 or 29. By definition, an integer is a prime number if it has no integer factor other than 1 and itself. Hence, 1 is not a prime number. The use of such coding expansion factor may facilitate simplifying interleaving and de-interleaving networks of the LDPC codes. In accordance with the principle of the LDPC codes, each element in the basic check matrix corresponds to a number of cyclically shifted bits. According to some principle, the use of the above values may simplify the interleaving and de-interleaving networks, which in turn reduces the complexity of the LDPC codes (nearly 40% of the decoding complexity of the LDPC codes lies in the interleaving network and once the interleaving network is simplified, the decoding complexity of the LDPC codes can be reduced).

Optionally, examples of the values of the expansion factor can be given here. For example, the coding expansion factor may equal to a product of a positive integer power of 2 and a prime number and the prime number may include one of 3 or 5 and the positive integer may include one of 1, 2, 3, 4, 5, 6, 7 or 8. It is advantageous to use the expansion factor to reduce the complexity of the LDPC decoder and support a flexible design of code length. An LDPC decoder typically includes a storage module, an interleaving network module, a de-interleaving network module and a computation module. The storage module stores updated total soft information, which is a sum of all extrinsic information. In the decoder, one storage block needs to be allocated for each column of the basic check matrix (e.g., for a basic check matrix having mb rows and nb columns, nb storage blocks are needed) and each storage block is divided into a number of address blocks each defined as one word. Hence, one storage block may store a number of words. In designing the LDPC decoding, the degree of parallelism of the decoding typically equals to the size of one word, which refers to the number of soft bits stored in one word. In this example, the maximum prime number is 5 and the maximum power of 2 is $2^8$. Accordingly, in the LDPC decoder, each storage block has five words and each word has a size of $2^8=256$. During the LDPC decoding process, data is first read from the storage module, then subjected to processing by the interleaving network module, computation module and de-interleaving network module, and finally written back to the storage module. When the expansion factor equals to $5*2^8=1280$, five words can be filled exactly and each word has 256 soft bits of data. In a case with a flexible code length (i.e., where a different code length is obtained by changing the expansion factor), e.g., when the expansion factor is $5*2^4=80$, still five words are occupied, with each word storing only $2^4=16$ soft bits of data, which occurs every 16 bits in each word. In this case, when the data in a word is read for updating, there are only 16 effective check nodes to be updated in the computation unit in the decoder as only 16 effective data bits are available. When the expansion factor equals to a multiple (a power of 2) of the prime number 3, only 3 words are required for operation. In the decoder, when the expansion factor equals to a product of a positive integer (1, 2, 3, 4, 5, 6, 7 or 8) power of 2 and a prime number, the prime number may equal to 3 or 5 and the above hardware can be reused, i.e., a flexible code length design is possible.

In addition, the prime number can include 5 or 7 and the power of 2 can be 2 to the power of 1, 2, 3, 4, 5, 6, 7 or 8. In this case, the word size can also be 256 and 7 words are needed. Here, a larger prime number 7 is selected such that the expansion factor can be larger to support a larger code length. Optionally, the prime number can include 3, 5 or 7 and the power of 2 can be 2 to the power of 1, 2, 3, 4, 5, 6, 7 or 8. In this case, the word size can also be 256 and 7 words are needed as the maximum prime number is 7. When the expansion factor is a power of 3, 3 words are selected for operation. When the expansion factor is a power of 5, 5 words are selected for operation. When the expansion factor is a power of 7, 7 words are selected for operation. Here, a lager expansion factor can ensure that the LDPC codes having a larger code length can be supported, and a smaller expansion factor can ensure that the LDPC codes having a smaller code length can be supported, such that a reasonable value range can be achieved and a wide range of LDPC code lengths can be supported. In an optional embodiment of the present disclosure, an apparatus for LDPC encoding/decoding is provided. The apparatus includes:

an obtaining module 201 configured to obtain a code block size for structured LDPC coding;

a determining module 202 configured to determine a coding expansion factor z based on at least one of the code block size, a parameter kb of a basic check matrix, a positive integer value p or the basic check matrix;

a processing module 203 configured to encode a data sequence to be encoded, or decode a data sequence to be decoded, based on the basic check matrix and the coding expansion factor; and a storage module 204 configured to store at least the basic check matrix.

Here, in the obtaining module, the code block size may be limited to a value obtained by multiplying the parameter kb of the basic check matrix with one of a set of natural numbers sorted in ascending order. The parameter kb of the basic check matrix can be a difference between the number of columns of the basic check matrix and the number of rows of the basic check matrix. The parameter kb of the basic check matrix can be an integer ranging from 4 to 64. The set of natural numbers sorted in ascending order may include a plurality of subsets each having an equal difference within the subset. The difference for the i-th subset in the set of natural numbers sorted in ascending order can be smaller than the difference for the (i+1)-th subset, where i is a positive integer.

Optionally, in the determining module, the operation of determining the coding expansion factor based at least on the code block size and the positive integer value p can include: determining the coding expansion factor in accordance with: $\lceil CBS/(kb \times p) \rceil \times p$, where CBS is the code block size, kb is a difference between the number of columns of the basic check matrix and the number of rows of the basic check matrix, and p is the positive integer.

Optionally, the code block size can be one of a set of code block sizes. The coding expansion factor is one of a set of coding expansion factors. The set of code block sizes is a set of natural numbers stored in ascending order. The set of coding expansion factors is a set of natural numbers stored in ascending order. The number of dimensions of the set of code block sizes is larger than or equal to that of the set of coding expansion factors. Optionally, the set of code block sizes includes a number, a, of successive elements. When the first of the successive elements is larger than $z(j) \times kb$ and the last of the successive elements is smaller than or equal to $z(j+1) \times kb$, the coding expansion factor corresponding to the successive elements is $z(j+1)$, where a is a positive integer, $z(j)$ is the j-th element of the set of coding expansion factors. The coding expansion factor can be limited to $z(j+1)$ when the obtained code block size is one of the successive elements. The set of coding expansion factors can include a plurality of subsets each having an equal difference within the subset. The difference for the i-th subset of the plurality of subsets is smaller than the difference for the (i+1)-th subset, where i is a positive integer.

Optionally, the set of code block sizes can include at least products of the parameter kb of the basic check matrix and respective ones of the set of coding expansion factors, and integers spaced by a positive integer B among all the products.

Optionally, the coding expansion factor may equal to a positive integer power of 2 minus 1, or a product of a positive integer power of 2 and a prime number. In particular, the coding expansion factor may include one of: 7, 15, 31, 63, 127, 255, 511, 1023, 2047 or 4095.

Embodiment 3

According to an embodiment of the present disclosure, a method for data processing with structured LDPC codes is also provided. The method can implement the above method for LDPC encoding/decoding (details thereof will be omitted here). As used hereinafter, the term "method" or "module" can be software, hardware, or a combination thereof, capable of performing a predetermined function. While the apparatuses to be described in the following embodiments are preferably implemented in software, it can be contemplated that they can also be implemented in hardware or a combination of software and hardware.

According to an embodiment of the present disclosure, a method for data processing with structured LDPC codes is provided. The method is applied in a transmitter and includes the following steps.

1. Code Block Segmentation: A transport block having a length of CL is segmented into a plurality of code blocks.

2. A code block size for structured LDPC coding is obtained based on a code block size after the code block segmentation.

3. A coding expansion factor z is determined based on at least one of the code block size, a parameter kb of a basic check matrix, a positive integer value p or the basic check matrix.

4. A data sequence to be encoded is encoded based on the basic check matrix and the coding expansion factor.

Optionally, in the step 2, the coding expansion factor is determined based on the code block size. Here, the operation of determining the coding expansion factor based on the code block size can include: the code block size being one of a set of code block sizes, the set of code block sizes being a first set of natural numbers stored in ascending order; and the coding expansion factor being one of a set of coding expansion factors, the set of coding expansion factors being a second set of natural numbers stored in ascending order.

Optionally, each of the elements in the set of coding expansion factors that is larger than the positive integer value p is n times the positive integer value p, where n is a positive integer.

Optionally, the positive integer value p is an element of a subset Pset, which is a subset of a set of all positive integer factors of Pmax, where Pmax is an integer larger than 3 and smaller than or equal to 1024. Here, Pmax can be a maximum degree of parallelism of decoding that can be supported by an LDPC decoder at a data receiver. The degree of parallelism of decoding refers to the number of parity check code updates that can be performed simultaneously in an LDPC decoder. Pmax can be a maximum degree of parallelism that can be supported by the LDPC decoder. Typically, when the maximum degree of parallelism of decoding that can be supported by the LDPC decoder is Pmax, the LDPC decoder can support other degrees of parallelism smaller than Pmax, perhaps with some additional control circuits.

Further, optionally, all values of the positive integer value p constitute a subset nSet, which is a subset of a set of positive integers, Ns, and has a length of F, where the set of positive integers $Ns=\{1, 2, 3, \ldots, M\}$, where M is an integer larger than 1. The subset nSet can include one of: a subset of the first F elements of the set of positive integers Ns, a subset of the last F elements of the set of positive integers Ns, a subset of F prime numbers in the set of positive integers Ns, a subset of F odd numbers in the set of positive integers Ns or a subset of F even numbers in the set of positive integers Ns, where F is a positive integer smaller than M.

In an example of LDPC encoding at a transmitter, a size of a transport block to be transmitted is 4000 bits and a basic check matrix for LDPC codes is as follows, corresponding to a set of coding expansion factors: [2 4 6 8 10 12 16 20 24 32 40 48 64 80 96 128 160 192 256 320 384 512 640 768 1024 1280]. The set of expansion factors includes products of 5 and 2 to the power of [1 2 3 4 5 6 7 8], i.e., [10 20 40 80 160 320 640 1280]; products of 3 and 2 to the power of [1 2 3 4 5 6 7 8], i.e., [6 12 24 48 96 192 384 768]; products of 2 and 2 to the power of [1 2 3 4 5 6 7 8], i.e., [4 8 16 32 64 128 256 512]; and products of 1 and 2 to the power of [1 2 3 4 5 6 7 8], i.e., [2 4 8 16 32 64 128 256]. Hence, the subset nSet includes values of [1 2 3 5] and the subset Pset includes values of [2 4 8 16 32 64 128 256]. Each of the elements in the set of coding expansion factors is n times the positive integer value p, where n is an element of the subset nSet and p is an element of the subset Pset. The basic check matrix can also be referred to as basic check matrix or the like. The expansion factor can also be referred to as lifting size, sub-matrix size or the like. The parameter kb of the basic check matrix is the number of system columns of the basic check matrix. When the total number of columns of the basic check matrix is nb and the total number of rows of the basic check matrix is mb, kb=nb−mb. In this example, the number of system columns of the basic check matrix kb=8, the number of rows mb=18, the total number of columns nb=26, which satisfy kb=nb-mb. The basic check matrix for LDPC codes equals to:

| 0 | 0 | 0 | 0 | 0 | 0 | 0 | 0 | 0 | -1 | -1 | -1 | -1 | -1 | -1 | -1 | -1 | -1 | -1 | -1 | -1 | -1 | -1 | -1 | -1 | -1 |
|---|---|---|---|---|---|---|---|---|---|---|---|---|---|---|---|---|---|---|---|---|---|---|---|---|---|
| 567 | -1 | 82 | 962 | 1207 | 731 | 342 | 1 | 851 | 0 | -1 | -1 | -1 | -1 | -1 | -1 | -1 | -1 | -1 | -1 | -1 | -1 | -1 | -1 | -1 | -1 |
| 739 | 147 | 523 | 871 | 686 | 427 | 1235 | 2 | -1 | 383 | 0 | -1 | -1 | -1 | -1 | -1 | -1 | -1 | -1 | -1 | -1 | -1 | -1 | -1 | -1 | -1 |
| -1 | 1039 | 594 | 681 | 226 | 1135 | 508 | 2 | -1 | -1 | 443 | 0 | -1 | -1 | -1 | -1 | -1 | -1 | -1 | -1 | -1 | -1 | -1 | -1 | -1 | -1 |
| 1168 | -1 | -1 | 1241 | 383 | -1 | 1 | -1 | -1 | -1 | -1 | 729 | 0 | -1 | -1 | -1 | -1 | -1 | -1 | -1 | -1 | -1 | -1 | -1 | -1 | -1 |
| -1 | 1064 | 18 | -1 | 762 | -1 | -1 | -1 | -1 | -1 | -1 | -1 | 0 | -1 | -1 | -1 | -1 | -1 | -1 | -1 | -1 | -1 | -1 | -1 | -1 | -1 |
| 2 | 977 | 1049 | -1 | -1 | 775 | -1 | -1 | -1 | -1 | -1 | -1 | -1 | 0 | -1 | -1 | -1 | -1 | -1 | -1 | -1 | -1 | -1 | -1 | -1 | -1 |
| 728 | -1 | -1 | 1001 | -1 | 1 | 320 | -1 | -1 | -1 | -1 | -1 | -1 | -1 | 0 | -1 | -1 | -1 | -1 | -1 | -1 | -1 | -1 | -1 | -1 | -1 |
| 788 | 1192 | 328 | -1 | -1 | -1 | -1 | -1 | -1 | -1 | -1 | -1 | -1 | -1 | -1 | 8 | -1 | -1 | -1 | -1 | -1 | -1 | -1 | -1 | -1 | -1 |
| 220 | 2 | -1 | -1 | -1 | -1 | -1 | -1 | -1 | 713 | -1 | -1 | -1 | -1 | -1 | -1 | 0 | -1 | -1 | -1 | -1 | -1 | -1 | -1 | -1 | -1 |
| -1 | 183 | -1 | -1 | 1 | -1 | -1 | -1 | -1 | -1 | 560 | -1 | -1 | -1 | -1 | -1 | -1 | 0 | -1 | -1 | -1 | -1 | -1 | -1 | -1 | -1 |
| 343 | -1 | -1 | -1 | -1 | 1265 | -1 | -1 | -1 | -1 | -1 | -1 | -1 | -1 | -1 | -1 | -1 | -1 | 0 | -1 | -1 | -1 | -1 | -1 | -1 | -1 |
| 88 | 372 | -1 | 319 | -1 | -1 | 1225 | -1 | -1 | -1 | -1 | -1 | 86 | -1 | -1 | -1 | -1 | -1 | -1 | 0 | -1 | -1 | -1 | -1 | -1 | -1 |
| -1 | 607 | 378 | -1 | -1 | -1 | -1 | 671 | -1 | -1 | -1 | -1 | -1 | -1 | -1 | -1 | -1 | -1 | -1 | -1 | 0 | -1 | -1 | -1 | -1 | -1 |
| 965 | -1 | -1 | 475 | -1 | -1 | -1 | -1 | -1 | -1 | -1 | -1 | -1 | -1 | -1 | -1 | -1 | -1 | -1 | -1 | -1 | 0 | -1 | -1 | -1 | -1 |
| 353 | 471 | -1 | -1 | -1 | -1 | -1 | 1031 | -1 | -1 | -1 | -1 | -1 | -1 | -1 | -1 | -1 | -1 | -1 | -1 | -1 | -1 | 0 | -1 | -1 | -1 |
| 2 | -1 | -1 | -1 | -1 | -1 | -1 | -1 | 171 | -1 | -1 | -1 | -1 | -1 | -1 | -1 | -1 | -1 | -1 | -1 | -1 | -1 | -1 | 0 | -1 | -1 |
| -1 | 619 | -1 | -1 | -1 | -1 | -1 | -1 | -1 | 410 | -1 | -1 | -1 | -1 | -1 | -1 | -1 | -1 | -1 | -1 | -1 | -1 | -1 | -1 | -1 | 0 |

The set of code block sizes includes at least products of kb=8 and respective ones of the set of coding expansion factors, i.e., [16 32 48 64 80 96 128 160 192 256 320 384 512 640 768 1024 1280 1536 2048 2560 3072 4096 5120 6144 8192 10240].

This example includes the following steps.

1. Code Block Segmentation: the transport block having a length of CL=4000 is segmented into a plurality of code blocks. Since the length of the transport block, 4000 bits, is smaller than the maximum value (10240) in the above set of code block sizes, only one code block having a length of 4000 bits is obtained in the code block segmentation.

2. Based on the code block size (4000) after the code block segmentation, the code block size (4000) for structured LDPC coding is obtained.

3. A coding expansion factor z is determined based on at least the code block size. In this case, since the minimum value in the set of code block sizes that is larger than 4000 is 4096, the system bit length of the LDPC codes (i.e., the number of bits inputted to the LDPC encoder) is 4096 and the number of padding bits need to be added is 4096−4000=96. In the set of code block sizes, 4096 corresponds to the expansion factor of 512 and thus the expansion factor used in the encoding is z=512. Based on the expansion factor z=512, all the elements in the basic check matrix are modified according to the following equation:

$$(h_{ij}^b)_{modified} = \begin{cases} -1 & \text{if } (h_{ij}^b)_{uniform} == -1 \\ \lfloor (h_{ij}^b)_{uniform} \times z / z_{max} \rfloor & \text{else} \end{cases}.$$

4. A data sequence to be encoded is encoded based on the basic check matrix and the coding expansion factor, to obtain an LDPC codeword having a length of 13312 bits. A codeword having a corresponding code length can be selected from the LDPC codeword based on a coding rate R. For example, when the coding rate R=½, the code length to be transmitted is 4000/(½)=8000 bits. In this case, 8000 bits are selected from the 13312 bits for transmission. In particular, the selection is performed as follows. The codeword having the length of 512*26=13312 is permuted in units of z=512 with a permutation vector of [0~7, [8, 9, 11, 10], 12:25]. Starting from the z*2=1024$^{th}$ bit, the selection is performed in a wrap-around manner, i.e., the selection goes back to the first bit once it reaches the last bit, and the padding bits will be skipped, so as to select an LDPC codeword of N=8000 bits. The LDPC codeword of N=8000 bits is then transmitted.

Correspondingly to the above example, a receiver is provided for receive the transmitted LDPC codeword. An LDPC decoding method at the receiver includes the following steps.

1. Data is received and demodulated to obtain information having a length of 8000 soft bits, i.e., a data sequence to be decoded and having a length of 8000.

2. A code block size (4000) for structured LDPC coding is obtained. The code block size can be obtained via system configuration signaling.

3. A coding expansion factor z is determined based on at least the code block size. The methods for determining the coding expansion factor z and modifying the basic check matrix are the same as those performed at the transmitter as described above and details thereof will be omitted here.

4. The data sequence to be decoded and having a length of 8000 is decoded based on the basic check matrix and the coding expansion factor. Since the actual code length of the basic check matrix is 13312 and the number of padding bits is 96, the soft bit information at the padding positions can be set to a very large value, and the information of the 8000 soft bits can be placed at the positions of the selected bits in the corresponding codeword having the length of 13312, while other soft information (at positions of punctured or non-transmitted bits) can be equal to 0. Then, the soft information sequence to be decoded and having the length of 13312 is decoded to output 4096 system bits, from which the padding bits are removed to obtain the data having a length of 4000 bits. During the decoding process, the corresponding set of coding expansion factors is [2 4 6 8 10 12 16 20 24 32 40 48 64 80 96 128 160 192 256 320 384 512 640 768 1024 1280]. The set of expansion factors includes products of 5 and 2 to the power of [1 2 3 4 5 6 7 8], i.e., [10 20 40 80 160 320 640 1280], denoted as Set Z0; products of 3 and 2 to the power of [1 2 3 4 5 6 7 8], i.e., [6 12 24 48 96 192 384 768], denoted as Set Z1; products of 2 and 2 to the power of [1 2 3 4 5 6 7 8], i.e., [4 8 16 32 64 128 256 512], denoted as Set Z2; and products of 1 and 2 to the power of [1 2 3 4 5 6 7 8], i.e., [2 4 8 16 32 64 128 256], denoted as Set Z3. Hence, the maximum degree of parallelism of decoding that can be supported in the decoder is $2^8$=256, i.e., Pmax=256. In the decoder, 5 words can be stored at maximum, each having a length of 256. When the expansion factor used in the encoding is in any of the above sets, e.g., when it is in Set Z0, the soft information in the decoder is stored in 5 words; when it is in Set Z1, the soft information in the decoder is stored in 3 words; when it is in Set Z2, the soft information in the decoder is stored in 2 words; or when it is in Set Z3, the soft information in the decoder is stored in 1 word. The decoding method similar to the one described in Embodiment 2 can be utilized, such that a flexible code length design can be supported.

Further, the LDPC codes may include the following example. The basic check matrix, as follows, has mb=8 row, kb=8 system columns and nb=16 columns. The set of expansion factors is [18 21 30 35 42 63 70 105 126 210], including two sets [6 7 14 21 42]*3 and [6 7 14 21 42]*5. The subset Pset is [6 7 14 21 42] and the subset nSet is [3 5]. The basic check matrix equals to:

| 50 | 75 | 141 | 188 | 127 | 124 | −1 | 194 | 127 | −1 | −1 | −1 | −1 | −1 | −1 | −1 |
|---|---|---|---|---|---|---|---|---|---|---|---|---|---|---|---|
| 47 | 15 | 146 | 106 | 192 | 169 | 194 | 49 | 126 | 15 | −1 | −1 | −1 | −1 | −1 | −1 |
| 0 | 104 | −1 | 22 | 16 | 101 | 186 | 106 | 39 | 39 | 113 | −1 | −1 | −1 | −1 | −1 |
| 189 | 165 | −1 | 57 | 139 | 15 | 57 | 67 | 145 | −1 | 195 | 67 | −1 | −1 | −1 | −1 |
| −1 | 44 | 79 | 150 | 65 | 49 | 193 | 183 | −1 | 150 | 77 | 74 | 191 | −1 | −1 | −1 |
| 149 | −1 | 2 | 21 | −1 | 24 | 37 | 69 | 175 | 26 | 4 | 42 | 190 | 66 | −1 | −1 |
| 123 | 199 | 31 | −1 | 128 | −1 | −1 | −1 | 132 | 119 | 9 | −1 | 14 | 187 | 203 | −1 |
| −1 | 171 | 179 | 6 | 193 | −1 | 196 | −1 | −1 | 165 | 188 | 175 | 64 | 110 | 150 | 1 |

Similarly, the transmitter can perform data processing in accordance with the above steps, determine the expansion factor and the basic check matrix and perform structured LDPC encoding. Details of these steps will be omitted here. Similarly, the receiver can operate in accordance with the above steps. The maximum degree of parallelism that can be used by the decoder at the receiver is the largest element 42 in the subset Pset. In the LDPC decoder, the degree of parallelism of decoding can be 42 or any smaller integer factor of 42. In the decoder, if the expansion factor used in the encoding is one of [6 7 14 21 42]*3, the soft information required for decoding can be stored in a storage block consisting of 3 words. If the expansion factor used in the encoding is determined as 63, the actual degree of parallelism of decoding is 31 as it is divided into 3 words. If the expansion factor used in the encoding is one of [6 7 14 21 42]*5, the soft information required for decoding can be stored in a storage block consisting of 5 words. When the expansion factor used in the encoding is 70 for example, the actual degree of parallelism of decoding is 14 as it is divided into 5 words.

Embodiment 4

According to an embodiment of the present disclosure, a method for data processing with structured LDPC codes is also provided. The method can implement the above method for LDPC encoding/decoding (details thereof will be omitted here). As used hereinafter, the term "method" or "module" can be software, hardware, or a combination thereof, capable of performing a predetermined function. While the apparatuses to be described in the following embodiments are preferably implemented in software, it can be contemplated that they can also be implemented in hardware or a combination of software and hardware.

According to an embodiment of the present disclosure, a method for data processing with structured LDPC codes is provided. The method is applied in a transmitter and includes the following steps.

1. Code Block Segmentation: A transport block having a length of CL is segmented into a plurality of code blocks.

2. A code block size for structured LDPC coding is obtained based on a code block size after the code block segmentation.

3. A coding expansion factor z is determined based on the code block size, a parameter kb of a basic check matrix, a positive integer value p and the basic check matrix. The expansion factor z is n times a positive integer pl. In particular, the positive integer pl is an element of a subset Pset, which is a subset of a set of all positive integer factors of Pmax, where n is a natural number and Pmax is an integer larger than or equal to 4. All values of the positive integer n constitute a subset nSet, which is a subset of a set of positive integers, Ns, and has a length of F, where the set of positive integers Ns={1, 2, 3, . . . , M}, where M is an integer larger than 1.

The basic check matrix has the following parameters: the number of system columns, kb, the number of rows (or check columns), mb, and the total number of columns, nb, where kb=nb-mb. The basic check matrix includes at least two types of elements: 1) elements each indicating an all-zero square matrix, denoted herein as −1 (which can instead be denoted as null or any other descriptor); and 2) elements each indicating a square matrix obtained by cyclically shifting an identity matrix (i.e., a non-all-zero matrix), denoted as an integer which is larger than or equal to 0 and smaller than the expansion factor and indicates the number of bits by which the identity matrix is cyclically shifted. The basic check matrix may also include a multi-sided structure, which means that it includes at least: two elements at the same pair of row index and column index, indicating a sum of two square matrices cyclically shifted by particular numbers of bits.

Any element $hb_{ij}$ in the basic check matrix that indicates a non-all-zero square matrix satisfies mod(hbij, (Pmax/pl))= 0, where i=0, 1, 2 . . . , mb−1, j=0, 1, . . . , nb−1, and Pmax is an integer larger than or equal to 4.

4. A data sequence to be encoded is encoded based on the basic check matrix and the coding expansion factor.

As described above, a basic check matrix used in the method for structured LDPC encoding is provided below. The parameters are Pmax=42, Pset={6 21 42}, and nSet={3 5}. The value of the expansion factor for the basic check matrix is dependent on Pset and nSet, i.e., equal to 3*Pset and 5*Pset. That is, all the expansion factors constitute a set {18 30 63 105 126 210}. It can be seen that Pset is a subset of a set of all positive integer factors of Pmax. The basic check matrices corresponding to the respective expansion factors are described as follows, where the number of system columns kb=8, the number of rows (or check columns) mb=4, the total number of columns nb=12, i.e., kb=nb-mb.

For the expansion factor of 18, corresponding to p=6 and n=3, the basic check matrix Hb0 is:

| 14 | 14 | 14 | 7 | 14 | 7 | 7 | 0 | 7 | −1 | −1 | −1 |
|---|---|---|---|---|---|---|---|---|---|---|---|
| 14 | 14 | 0 | 0 | 0 | 7 | 7 | 0 | 14 | 0 | −1 | −1 |
| 0 | 14 | 7 | 7 | 7 | 14 | 14 | 14 | 7 | 0 | 0 | −1 |
| 0 | 14 | 7 | 0 | 0 | 7 | 14 | 14 | 7 | 7 | 7 | 14 |

For the expansion factor of 30, corresponding to p=6 and n=5, the basic check matrix Hb1 is:

| 7 | 7 | 21 | 28 | 28 | 21 | 28 | 0 | 7 | −1 | −1 | −1 |
|---|---|---|---|---|---|---|---|---|---|---|---|
| 14 | 21 | 28 | 21 | 0 | 14 | 21 | 7 | 7 | 0 | −1 | −1 |
| 28 | 7 | 7 | 21 | 21 | 7 | 0 | 21 | 28 | 7 | 21 | −1 |
| 28 | 7 | 21 | 21 | 21 | 7 | 28 | 7 | 28 | 7 | 21 | 21 |

For the expansion factor of 63, corresponding to p=21 and n=3, the basic check matrix Hb2 is:

$$\begin{matrix} 60 & 32 & 20 & 48 & 56 & 10 & 4 & 34 & 4 & -1 & -1 & -1 \\ 4 & 2 & 14 & 22 & 20 & 38 & 8 & 38 & 36 & 44 & -1 & -1 \\ 48 & 54 & 52 & 54 & 32 & 24 & 56 & 60 & 46 & 30 & 4 & -1 \\ 28 & 40 & 8 & 52 & 0 & 52 & 58 & 6 & 16 & 50 & 10 & 40 \end{matrix}$$

For the expansion factor of 105, corresponding to p=21 and n=5, the basic check matrix Hb3 is:

$$\begin{matrix} 52 & 40 & 94 & 70 & 2 & 2 & 12 & 14 & 90 & -1 & -1 & -1 \\ 96 & 12 & 44 & 22 & 100 & 94 & 64 & 54 & 14 & 100 & -1 & -1 \\ 16 & 82 & 64 & 90 & 62 & 98 & 30 & 36 & 14 & 24 & 62 & -1 \\ 14 & 42 & 3 & 4 & 50 & 62 & 48 & 54 & 34 & 46 & 0 & 80 \end{matrix}$$

For the expansion factor of 126, corresponding to p=42 and n=3, the basic check matrix Hb4 is:

$$\begin{matrix} 37 & 83 & 46 & 86 & 83 & 29 & 52 & 83 & 122 & -1 & -1 & -1 \\ 98 & 26 & 51 & 71 & 48 & 65 & 109 & 27 & 1 & 2 & -1 & -1 \\ 24 & 76 & 54 & 40 & 68 & 19 & 36 & 80 & 76 & 37 & 109 & -1 \\ 71 & 43 & 108 & 27 & 38 & 18 & 121 & 52 & 104 & 70 & 45 & 117 \end{matrix}$$

For the expansion factor of 210, corresponding to p=42 and n=5, the basic check matrix Hb5 is:

$$\begin{matrix} 187 & 58 & 193 & 192 & 136 & 18 & 124 & 102 & 110 & -1 & -1 & -1 \\ 121 & 74 & 189 & 200 & 85 & 103 & 71 & 123 & 52 & 62 & -1 & -1 \\ 120 & 46 & 147 & 101 & 51 & 36 & 126 & 147 & 5 & 152 & 51 & -1 \\ 96 & 41 & 41 & 170 & 146 & 51 & 169 & 49 & 58 & 193 & 129 & 85 \end{matrix}$$

It can be seen from the above basic check matrices that any element $hb_{ij}$ in each basic check matrix that indicates a non-all-zero square matrix satisfies mod(hbij, (Pmax/pl))=0, where $hb_{ij}$ in each basic check matrix is an element that does not equal to −1.

Figure 10:
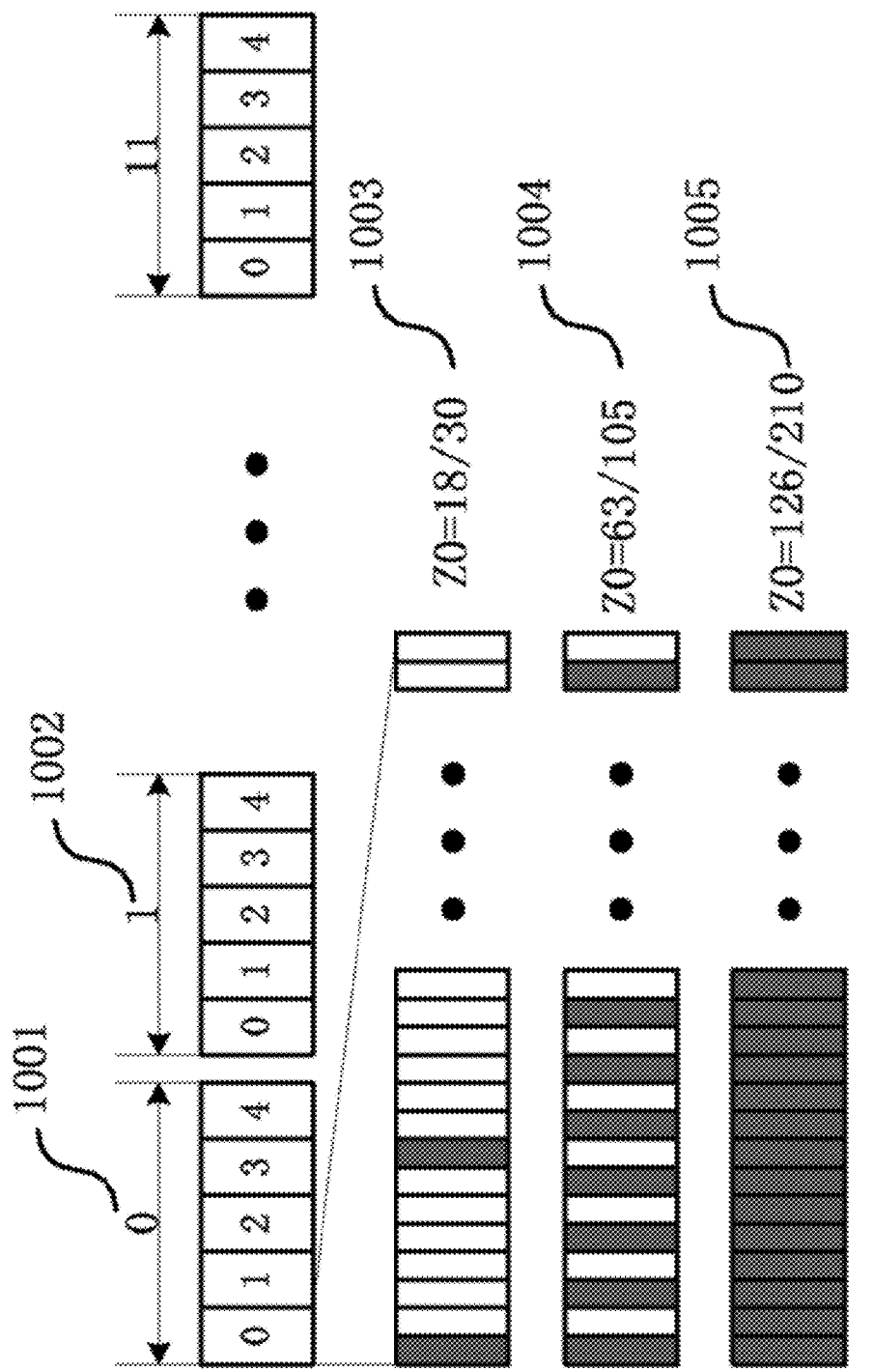
FIG. 10 is a schematic diagram showing a storage in an LDPC decoder according to an optional embodiment of the present disclosure.

The advantageous effects of using the above basic check matrices as the basic check matrices for LDPC encoding are similar to those described in connection with Embodiment 2. In this case, information is stored at addresses in units of words, which makes the information storage very simple and easy to support a flexible code length design. The above Hb0 is taken as an example in the following description. In this case, the storage module of the decoder is shown in FIG. 10. The total number of columns of the basic check matrix is 12. Accordingly, there are 12 storage blocks each having 5 words. As shown in FIG. 10, 1001 corresponds to the storage block for Column 0 of the basic check matrix and 1002 corresponds to Column 1 of the basic check matrix. The size of each words equals to Pmax=42, i.e., the maximum supported degree of parallelism is Pmax. The storage blocks can be shared for different expansion factors. For Hb0 and Hb1, the storage modules corresponding to 1003 as shown in FIG. 10 can be used, with the black color indicating the stored information. Since in this case the expansion factors are 18 and 30, the soft bit information corresponding to each column of the basic check matrix includes 18 and 30 only. Hence, the soft bit information is placed every 7 bits in each word. Hb0 uses 3 words and Hb1 uses 5 words.

Similarly, for Hb2 and Hb3, the storage modules corresponding to 1004 as shown in FIG. 10 can be used, with the black color indicating the stored information. Since in this case the expansion factors are 63 and 105, the soft bit information corresponding to each column of the basic check matrix includes 63 and 105 only. Hence, the soft bit information is placed every 2 bits in each word. Hb2 uses 3 words and Hb3 uses 5 words.

Similarly, for Hb4 and Hb5, the storage modules corresponding to 1005 as shown in FIG. 10 can be used, with the black color indicating the stored information. Since in this case the expansion factors are 126 and 210, the soft bit information corresponding to each column of the basic check matrix includes 126 and 210 only. Hence, each word is filled with the soft bit information. Hb2 uses 3 words and Hb3 uses 5 words.

With the set of expansion factors and the basic check matrix as described above, it is advantageous in that only one LDPC decoder is sufficient, which significantly reduces the complexity due to the use of a number of decoders. Further, the interleaving network of each column in the basic check matrix can be shared or implemented using a fixed circuit network, such that the complexity and the decoding latency can be reduced.

In addition, a basic check matrix is provided as follows, where the expansion factor is 63, corresponding to p=21 and n=3. The basic check matrix Hb6 satisfies mod(hbij, (Pmax/pl))=A, where A=1:

$$\begin{matrix} 51 & 11 & 1 & 17 & 51 & 23 & 57 & 33 & 33 & -1 & -1 & -1 \\ 27 & 53 & 53 & 13 & 41 & 57 & 57 & 17 & 9 & 15 & -1 & -1 \\ 3 & 19 & 61 & 59 & 9 & 45 & 13 & 39 & 33 & 55 & 29 & -1 \\ 41 & 43 & 31 & 43 & 7 & 13 & 43 & 41 & 7 & 61 & 29 & 43 \end{matrix}$$

The methods according to the optional embodiments of the present disclosure can be applied in the Long Term Evolution (LTE) mobile communication system or the $5^{th}$ Generation (5G) mobile communication system in the future. The data transmission direction can be data transmitted from a base station to a mobile user device (i.e., downlink transmission traffic data) or data transmitted from a mobile user device to a base station (i.e., uplink transmission traffic data). The mobile user device may include a mobile device, which can be referred to as an access terminal, a user terminal, a user station, a user unit, a mobile station, a remote station, a remote terminal, a user agent, a user equipment, a user device, or any other terminology. A base station may include an Access Point (AP), which can be referred to as a Node B, a Radio Network Controller (RNC), an evolved Node B (eNB), a Base Station Controller (BSC), a Base Transceiver Station (BTS), a Base Station (BS), a Transceiver Function (TF), a radio router, a radio transceiver, a Basic Service Set (BSS), an Extended Service Set (ESS), a Radio Base Station (RBS) or any other terminology.

According to an aspect of an optional embodiment of the present disclosure, a method for data processing with structured LDPC codes is provided. It can be applied in scenarios such as enhanced Mobile Broad Band (eMBB), Ultra Reliable Low Latency Communications (URLLC) or massive Machine Type Communications (mMTC) in new Radio Access Technology (RAT). In the eMBB scenario, the maximum downlink throughput can be up to 20 Gbps and the maximum uplink data throughput can be up to 10 Gbps. In the URLLC scenario, Block Error Rate (BLER) as low as 10e-5 can be supported in terms of reliability, and the lowest latency in uplink and downlink could be as low as 0.5 ms. In the mMTC scenario, the batteries of devices can last for years. The method for data processing with structured LDPC codes according to this embodiment includes the following steps.

1. A code block size for structured LDPC coding is obtained.

2. A coding expansion factor z is determined based on at least one of the code block size, a parameter kb of a basic check matrix or a positive integer value p.

3. A data sequence to be encoded is encoded, or a data sequence to be decoded is decoded, based on the basic check matrix and the coding expansion factor.

Optionally, the operation of determining the coding expansion factor based on the code block size CBS, the parameter kb of the basic check matrix and the positive integer value p includes: determining the coding expansion factor in accordance with: $\lceil CBS/(kb \times p)\rceil \times p$, where $\lceil \ \rceil$ denotes a ceiling operation.

Optionally, the operation of obtaining the code block size for structured LDPC coding includes: the code block size being equal to a value obtained by multiplying the parameter kb of the basic check matrix with one of a set of natural numbers sorted in ascending order. The set of natural numbers sorted in ascending order includes a plurality of subsets each having an equal, first difference between neighboring elements. The first difference for the i-th subset in the set of natural numbers sorted in ascending order is smaller than the first difference for the (i+1)-th subset, where i is a positive integer. With this design, it is advantageous in that the natural numbers in the set of natural numbers sorted in ascending order increase step by step, such that the code block sizes they support vary at a small interval for a small length and for a large length. That is, denser code block sizes would not be needed, such that the communication system can be more flexible. Moreover, fewer signaling indications and fewer signaling interactions would be needed, such that the system complexity can be reduced.

Alternatively, optionally, the operation of determining the coding expansion factor based on the code block size includes: the code block size being one of a set of code block sizes, the set of code block sizes being a first set of natural numbers stored in ascending order; and the coding expansion factor being one of a set of coding expansion factors, the set of coding expansion factors being a second set of natural numbers stored in ascending order. Optionally, the set of code block sizes includes a number, a, of successive elements. When the first of the successive elements is larger than $z(j) \times kb$ and the last of the successive elements is smaller than or equal to $z(j+1) \times kb$, the coding expansion factor corresponding to the successive elements is $z(j+1)$, where a is a positive integer, $z(j)$ is the j-th element of the set of coding expansion factors, j is a positive integer and kb is the parameter of the basic check matrix. The coding expansion factor is $z(j+1)$ when the obtained code block size is one of the successive elements. The set of coding expansion factors includes a plurality of subsets each having an equal, second difference between neighboring elements. The second difference for the h-th subset of the plurality of subsets is smaller than the second difference for the (h+1)-th subset, where h is a positive integer. The set of code block sizes includes at least products of the parameter kb of the basic check matrix and respective ones of the set of coding expansion factors, and integers spaced by a positive integer B among all the products.

Alternatively, the coding expansion factor is determined as $z(j+1)$ when a ratio of the code block size to the parameter kb of the basic check matrix is larger than $z(j)$ and smaller than or equal to $z(j+1)$, where $z(j)$ is the j-th element of the set of coding expansion factors. Each of the elements in the set of coding expansion factors that is larger than the first positive integer value p is a multiple of the first positive integer value p. The positive integer value p is a degree of parallelism of LDPC decoding. The purpose of limiting the expansion factor to equal to a multiple of the degree p of parallelism is that the layered LDPC decoding process can eliminate the address collision problem in the interleaving and de-interleaving networks in the decoder, without any additional overhead of hardware circuit indications, such that the decoding complexity can be reduced and a smaller area of hardware circuit is required.

Figure 9:
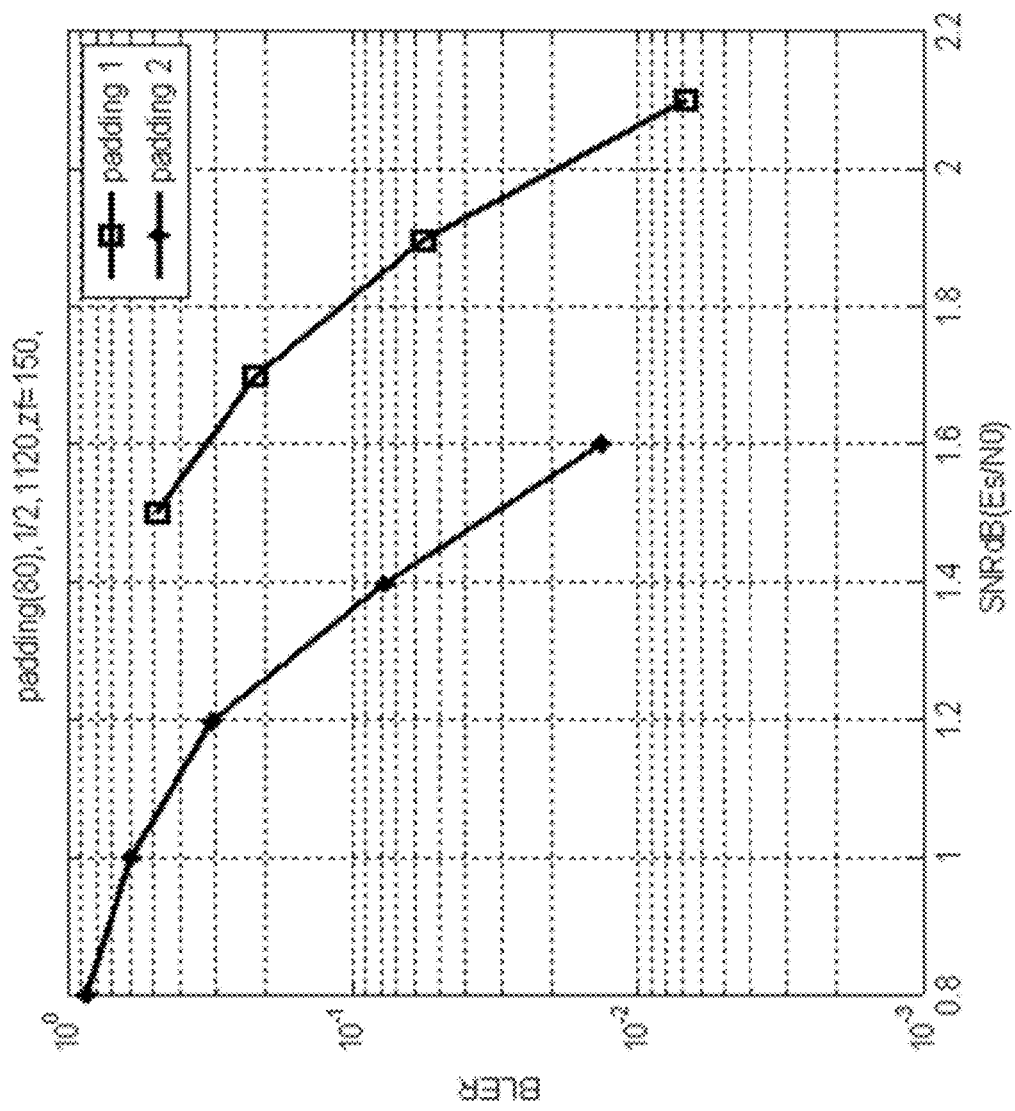
FIG. 9 is a schematic diagram showing a performance comparison between different padding schemes in an additive white noise channel according to an optional embodiment of the present disclosure.

Optionally, the method can further include, prior to encoding the data sequence to be encoded based on the basic check matrix and the coding expansion factor: adding padding bits to a first data sequence by dividing the first data sequence into a plurality of data sub-sequences and adding padding bits to each of the plurality of data sub-sequences, such that all the data sub-sequences with the padding bits constitute the data sequence to be encoded. Alternatively, the method can further include, prior to encoding the data sequence to be encoded based on the basic check matrix and the coding expansion factor: adding padding bits to a second data sequence by dividing the second data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor. The method can further include, prior to adding the padding bits to the first or second data sequence: adding an L-bit Cyclic Redundancy Check (CRC) sequence to a third data sequence to obtain the first or second data sequence, where L is an integer larger than or equal to 0. FIG. 9 shows a performance comparison in an additive white noise channel. Here, the code block size is 1120, the expansion factor of the structured LDPC codes is 150, the number of system columns of the basic check matrix is kb=8, and the number of padding bits is 80. In the figure, the conventional padding scheme (i.e., in which 80 padding bits are added at the head portion or the end portion) is denoted as padding1 and the scheme according to the present disclosure is denoted as padding2. 1120 is divided into 8 data sub-sequences each having 140 bits plus 10 padding bits (i.e., 150 bits). The data sub-sequences are combined to obtain a system bit sequence. From the performances shown in FIG. 9, it can be seen that the padding solution according to the present disclosure can obtain a higher gain (approximately 0.4 dB). Alternatively, before encoding the data sequence to be encoded based on the basic check matrix and the coding expansion factor, a bit padding operation is included, which includes: dividing the first data sequence into a plurality of data sub-sequences and adding padding bits to each of the plurality of data sub-sequences, such that all the data sub-sequences with the padding bits constitute the data sequence to be encoded. Before encoding the data sequence to be encoded based on the basic check matrix and the coding expansion factor, a bit padding operation is included, which includes: dividing the first data sequence into kb data sub-sequences each including z or less bits and adding padding bits to each of the data sub-sequences such that each of the data sub-sequences includes z bits and all the data sub-sequences with the padding bits constitute the data sequence to be encoded, where kb is the parameter of the basic check matrix and z is the coding expansion factor. Before the bit padding operation, an L-bit Cyclic Redundancy Check (CRC) sequence can be added to a second data sequence to obtain the first data sequence, where L is an integer larger than or equal to 0.

The above positive integer value p is a fixed positive integer. The degree p of parallelism of LDPC decoding includes a positive integer power of 2 or a product of a positive integer power of 2 and a prime number. It is advantageous in that p can be a multiple of a small value. In the layered LDPC decoding process, if a lower hardware complexity is desired, a smaller degree p of parallelism of layered decoding can still be used, which can in turn support a circuit design with a lower power consumption so as to be used in e.g., the nMTC scenario.

Optionally, the parameter kb of the basic check matrix is a difference between the number of columns of the basic check matrix and the number of rows of the basic check matrix, where kb is an integer larger than or equal to 4 and smaller than or equal to 64. The parameter kb of the basic check matrix is the number of system columns of the basic check matrix. The coding expansion factor equals to a positive integer power of 2 minus 1, or a product of a positive integer power of 2 and a prime number. In particular, the coding expansion factor includes one of: 7, 15, 31, 63, 127, 255, 511, 1023, 2047 or 4095.

A more specific example is given below.

Example 1

Figure 6:
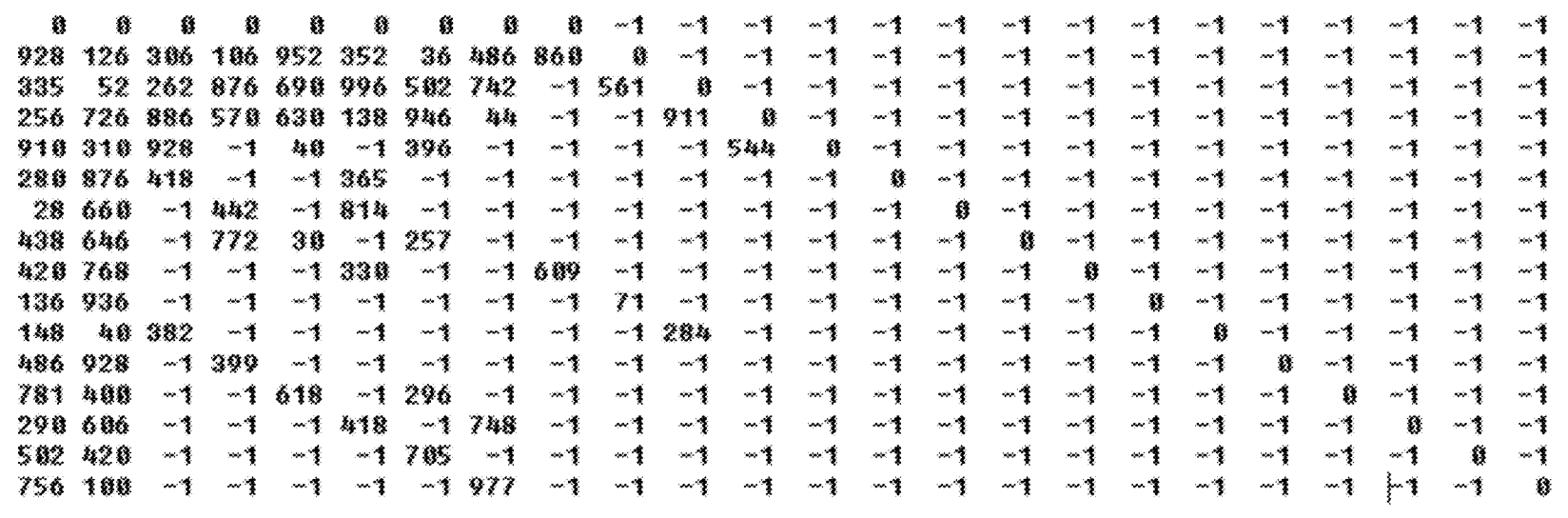

FIG. 6 is a schematic diagram showing a basic check matrix according to an optional embodiment of the present disclosure. In the 5G mobile communications, at a transmitter in an eMBB scenario, a source data packet to be transmitted has a size of 7952 bits and a code block size is 4000. It is known that the basic check matrix (16 rows*24 columns) is as follows. The maximum supported expansion factor is zmax=1000.

It can be known that the basic check matrix as shown in FIG. 6 has the following parameters: the number of rows of the basic check matrix mb=16, the number of columns of the basic check matrix nb=24, and the number of system columns of the basic check matrix kb=nb−mb=8. It is assumed that the degree of parallelism used in the decoding is p=20, each code block size has a 24-bit CRC sequence and the coding rate is ½. As described above, the method for data processing with structured LDPC codes includes the following steps.

At step 1, a code block size for structured LDPC coding is obtained, i.e., CBS=4000.

At step 2, a coding expansion factor z is determined based on at least one of the code block size, a parameter kb of a basic check matrix or a first positive integer value p.

In the step 2, the operation of determining the coding expansion factor based on the code block size CBS, the parameter kb of the basic check matrix and the first positive integer value p includes: determining the coding expansion factor in accordance with: [CBS/(kb×p)]×p, where ⌈ ⌉ denotes a ceiling operation. It can be known that the expansion factor is z'=500.

At step 3, a data sequence to be encoded is encoded based on the basic check matrix and the coding expansion factor.

In the step 3, since the above basic check matrix is based on the expansion factor of 1000, it needs to be modified according to:

$$(h_{ij}^b)_{modified} = \begin{cases} -1 & (h_{ij}^b)_{uniform} = -1 \\ \lfloor (h_{ij}^b)_{uniform} \times z / z_{max} \rfloor & (h_{ij}^b)_{uniform} \neq -1 \end{cases}$$

where $(h_{ij}^b)_{modified}$ is the value of the element at the i-th row and the j-th column of the modified basic check matrix, $(h_{ij}^b)_{uniform}$ is the value of the element at the i-th row and the j-th column of the above basic check matrix. Since the coding rate is ½, the number of rows of the basic check matrix as required can be calculated from kb, as: kb/R=16. The elements of 8 rows and 16 columns can be extracted directly from the modified basic check matrix, or the elements of 8 rows and 16 columns can be extracted from the basic check matrix first and then modified. FIG. 7 is a first schematic diagram showing a basic check matrix Hb' according to an optional embodiment of the present disclosure. As shown in FIG. 7, the basic check matrix Hb' to be used in the actual encoding can be obtained.

Code block segmentation can be applied to the source data packet having a size of 7952 bits (the number of bits in each data packet is as close to CBS-L=3976 as possible, where L is the number of bits of the CRC sequence) to obtain two second data sequences each having a length of 3976 bits. A CRC sequence of L=24 bits is added to each of the two second data sequences to obtain two first data sequences each having a length of 4000 bits. Since the number of actual system bits of the structured LDPC is kb×z'=8×500=4000 and kb×z=8×500=4000, the code block size is already equal to the number of actual system bits (4000) and thus no additional padding is required.

The data sequences to be encoded (the two first data sequences each having a length of 4000 bits) are encoded based on the above basic check matrix Hb'=8 and the coding expansion factor z'=500 to be used in the actual encoding, to obtain two LDPC code blocks each having a length of 8000 bits. The LDPC code blocks are modulated and transmitted.

At a receiver, the received data can be demodulated to obtain two soft information data sequences (i.e., data sequences to be decoded) each having a length of 8000 bits. Each of the soft information data sequences (each having a length of 8000 bits) is then decoded based on the above basic check matrix Hb' and the coding expansion factor z'=500 used in the actual encoding, to obtain a system bit sequence of the structured LDPC coding, from which a 24-bit CRC sequence is removed to obtain the source data packet having a length of 7952 bits.

Example 2

This example differs from Example 1 in that the source data packet to be transmitted has a size of 3256 bits. It is assumed that the code block size for the structured LDPC codes is 3360. The code block size for the structured LDPC coding is equal to a value obtained by multiplying the parameter kb=8 of the basic check matrix with one of a set of natural numbers sorted in ascending order. The set of natural numbers sorted in ascending order includes a plurality of subsets each having an equal, first difference between neighboring elements. The first difference for the i-th subset in the set of natural numbers sorted in ascending order is smaller than the first difference for the (i+1)-th subset, where i is a positive integer. For example, the set of natural numbers sorted in ascending order can be [[2:1:200], [202:2:400], [406:6:796], [804:8:1004]].

The ratio of the code block size 3360 to the parameter kb=8 of the basic check matrix is 420, which is larger than z(302)=418 and smaller than or equal to z(303)=424. Thus, the coding expansion factor is determined as z(303)=424. The basic check matrix is modified in accordance with z'=424. FIG. 8 is a second schematic diagram showing a basic check matrix Hb' according to an optional embodiment of the present disclosure. As shown in FIG. 8, the following basic check matrix Hb' can be obtained. That is, the following condition is met. The set of code block sizes includes a number, a, of successive elements. When the first of the successive elements is larger than z(j)×kb and the last of the successive elements is smaller than or equal to z(j+1)×kb, the coding expansion factor corresponding to the successive elements is z(j+1), where a is a positive integer, z(j) is the j-th element of the set of coding expansion factors, j is a positive integer and kb is the parameter of the basic check matrix. The coding expansion factor is z(j+1) when the obtained code block size is one of the successive elements.

The following condition is also met. The set of coding expansion factors includes a plurality of subsets each having an equal, second difference between neighboring elements. The second difference for the h-th subset of the plurality of subsets is smaller than the second difference for the (h+1)-th subset, where h is a positive integer.

Since the number of actual system bits for the structured LDPC is kb×z=8×424=3392, a CRC sequence of L=24 bits is added to the source data packet (i.e., the third data sequence) having a size of 3256 bits, to obtain a second data sequence having a length of 3384 bits. In this case, 8 padding bits can be added to obtain 3392 bits, e.g., by dividing the second data sequence into kb=8 data sub-sequences each including z=434 or less bits, and adding 1 padding bit to each of the data sub-sequences such that each of the data sub-sequences includes z=434 bits and all the data sub-sequences with the padding bits constitute the data sequence to be encoded and having a length of 3392. The data sequence to be encoded (the one data sequence having a length of 3392 bits) is encoded based on the above basic check matrix Hb' and the coding expansion factor z'=434 to be used in the actual encoding, to obtain one LDPC code block having a length of 6784 bits. The LDPC code block is modulated and transmitted.

Optionally, in the embodiments and optional embodiments of the present disclosure, the number of columns of the matrix is nb, the number of rows of the matrix is mb, and the number of system columns of the matrix is kb=nb−mb.

The above embodiments only illustrate, rather than limiting, the solutions of the present disclosure. Various modifications and alternatives can be made to the solutions of the present disclosure by those skilled in the art without departing from the spirit and scope of the present disclosure. The scope of the present disclosure is defined by the claims as attached.

Embodiment 5

According to an embodiment of the present disclosure, a method for data processing with structured LDPC codes is also provided. As used hereinafter, the term "method" or "module" can be software, hardware, or a combination thereof, capable of performing a predetermined function. While the apparatuses to be described in the following embodiments are preferably implemented in software, it can be contemplated that they can also be implemented in hardware or a combination of software and hardware.

According to an embodiment of the present disclosure, a method for data processing with structured LDPC codes is provided. The method is applied in a transmitter and includes the following steps.

1. Code Block Segmentation: A transport block having a length of CL is segmented into a plurality of code blocks.

2. A code block size for structured LDPC coding is obtained based on a code block size after the code block segmentation.

3. A coding expansion factor z is determined based on the code block size, a parameter kb of a basic check matrix, a positive integer value p and the basic check matrix. The expansion factor z is n times a positive integer p1. In particular, the positive integer p1 is an element of a subset Pset, and all values of the positive integer n constitute a subset nSet. Kmax≤kb×p1max×nmax≤1.2×Kmax, where p1max is the largest value in the subset Pset, nmax is the largest value in the subset nSet, and Kmax is an integer larger than 1024.

The basic check matrix for the structured LDPC coding is obtained. The basic check matrix has the following parameters: the number of system columns, kb, the number of rows (or check columns), mb, and the total number of columns, nb, where kb=nb−mb. The basic check matrix includes at least two types of elements: 1) elements each indicating an all-zero square matrix, denoted herein as −1 (which can instead be denoted as null or any other descriptor); and 2) elements each indicating a square matrix obtained by cyclically shifting an identity matrix (i.e., a non-all-zero matrix), denoted as an integer which is larger than or equal to 0 and smaller than the expansion factor and indicates the number of bits by which the identity matrix is cyclically shifted. The basic check matrix may also include a multi-sided structure, which means that it includes at least: two elements at the same pair of row index and column index, indicating a sum of two square matrices cyclically shifted by particular numbers of bits.

4. A data sequence to be encoded is encoded, or a data sequence to be decoded is decoded, based on the basic check matrix and the coding expansion factor z. The number of bits in the data sequence to be encoded is kb*z, and the length of the data sequence to be decoded is nb*z.

Further, Kmax equals to 2000, 2048, 4000, 4096, 6000, 6144, 8000, 8192, 12000 or 12288.

A more specific example is given here.

In the method for data processing with structured LDPC codes, the values of the expansion factor z are {4 6 8 10 12 14 16 20 24 28 32 40 48 56 64 80 96 112 128 160 192 224 256 320 384 448 512 640 768 896 1024} and the basic check matrix for the LDPC codes (corresponding to the maximum expansion factor of 1024) is:

| 363 | −1 | 835 | 515 | 1022 | 679 | 880 | 254 | 5 | 0 | −1 | −1 | −1 | −1 | −1 | −1 | −1 | −1 | −1 | −1 | −1 | −1 | −1 | −1 |
|---|---|---|---|---|---|---|---|---|---|---|---|---|---|---|---|---|---|---|---|---|---|---|---|
| 424 | 832 | 865 | 1003 | 505 | 550 | 619 | 16 | −1 | 448 | 0 | −1 | −1 | −1 | −1 | −1 | −1 | −1 | −1 | −1 | −1 | −1 | −1 | −1 |
| −1 | 734 | 188 | 582 | 929 | 304 | 874 | 10 | −1 | −1 | 699 | 0 | −1 | −1 | −1 | −1 | −1 | −1 | −1 | −1 | −1 | −1 | −1 | −1 |

-continued

```
 242  -1  -1 893 445  -1  16  -1  -1  -1  -1 958   0  -1  -1  -1  -1  -1  -1  -1  -1  -1  -1  -1  -1  -1
  -1 703   6  -1 297  -1  -1  -1  -1  -1  -1  -1  -1   0  -1  -1  -1  -1  -1  -1  -1  -1  -1  -1  -1  -1
 785 818  12  -1  -1 228  -1  -1  -1  -1  -1  -1  -1  -1   0  -1  -1  -1  -1  -1  -1  -1  -1  -1  -1  -1
 189 649  -1 252  -1   4 954  -1  -1  -1  -1  -1  -1  -1  -1   0  -1  -1  -1  -1  -1  -1  -1  -1  -1  -1
 920 420   4  -1  -1  -1  -1 165  -1  -1  -1  -1  -1  -1  -1  -1   0  -1  -1  -1  -1  -1  -1  -1  -1  -1
 460   2  -1  -1  -1  -1  -1  -1 985  -1  -1  -1  -1  -1  -1  -1  -1   0  -1  -1  -1  -1  -1  -1  -1  -1
 786 763  -1  -1   2  -1  -1  -1  -1  87  -1  -1  -1  -1  -1  -1  -1  -1   0  -1  -1  -1  -1  -1  -1  -1
 383 571  -1  -1  -1 800  -1  -1  -1  -1  -1  -1  -1  -1  -1  -1  -1  -1  -1   0  -1  -1  -1  -1  -1  -1
 473 348  -1 241  -1  -1   6  -1  -1  -1  -1 986  -1  -1  -1  -1  -1  -1  -1  -1   0  -1  -1  -1  -1  -1
  -1   2 531  -1  -1  -1  -1 905  -1  -1  -1  -1  -1  -1  -1  -1  -1  -1  -1  -1  -1   0  -1  -1  -1  -1
 290  -1  -1 634  -1  -1  -1  -1  -1  -1  -1  -1  -1  -1  -1  -1  -1  -1  -1  -1  -1  -1   0  -1  -1  -1
 365 123  -1  -1  -1  -1 926  -1  -1  -1  -1  -1  -1  -1  -1  -1  -1  -1  -1  -1  -1  -1  -1   0  -1  -1
1018  -1  -1  -1  -1  -1  -1 534  -1  -1  -1  -1  -1  -1  -1  -1  -1  -1  -1  -1  -1  -1  -1  -1   0  -1
  -1  12  -1  -1  -1  -1  -1  -1  -1 512  -1  -1  -1  -1  -1  -1  -1  -1  -1  -1  -1  -1  -1  -1  -1   0.
```

It can be seen from the above values of the expansion factor z that the expansion factor z is n times a positive integer pl. The positive integer pl is an element of a subset Pset, and all values of the positive integer n constitute a subset nSet. Here, Pset equals to {2 4 8 16 32 64 128} and nSet equals to {2 3 5 6 7 8}. In this example, Kmax=8000. The largest value in the subset Pset is plmax=128, and the largest value in the subset nSet is nmax=8. It can be seen that kb×plmax×nmax=8×128×8=8192, which satisfies Kmax≤kb×plmax×nmax≤1.2×Kmax.

According to the above encoding or decoding method, if the code block size obtained after the code block segmentation equals to 1024 bits, then the code block size for the structured LDPC coding is CBS=1024. The smallest value that is larger than or equal to CBS/kb=1024/8=256 is selected from the set of expansion factors, as the coding expansion factor for the structured LDPC codes. In this case, it is known that the expansion factor is 256. The basic check matrix is modified according to Embodiment 5 to obtain an encoding basic check matrix having an expansion factor of 256 (details thereof will be omitted here). The data sequence to be encoded and having a length of 1024 bits can be encoded based on the obtained expansion factor and the encoding basic check matrix. When the coding rate is ⅓, an LDPC codeword having a length of 3072 bits can be obtained. At a receiver, the data sequence to be decoded and having a length of 3072 bits can be decoded based on the obtained expansion factor and the encoding basic check matrix, to obtain decoded data having a length of 1024 bits. The decoded data of all code blocks can be combined to obtain the original data of the transport block transmitted from the transmitter.

The hardware implementation of the decoder as described in connection with Embodiment 3 can be used, which is advantageous in allowing the LDPC codes to support a flexible code length and a flexible code rate.

Embodiment 6

According to an embodiment of the present disclosure, a method for data processing with structured LDPC codes is also provided. As used hereinafter, the term "method" or "module" can be software, hardware, or a combination thereof, capable of performing a predetermined function. While the apparatuses to be described in the following embodiments are preferably implemented in software, it can be contemplated that they can also be implemented in hardware or a combination of software and hardware.

According to an embodiment of the present disclosure, a method for data processing with structured LDPC codes is provided. The method is applied in a transmitter and includes the following steps.

1. Code Block Segmentation: A transport block having a length of CL is segmented into a plurality of code blocks.

2. A code block size for structured LDPC coding is obtained based on a code block size after the code block segmentation.

3. A coding expansion factor z is determined based on the code block size, a parameter kb of a basic check matrix, a positive integer value p and the basic check matrix. The expansion factor z is n times a positive integer pl. In particular, the positive integer pl is an element of a subset Pset, and all values of the positive integer n constitute a subset nSet. Kmax≤kb×plmax×nmax≤1.2×Kmax, where plmax is the largest value in the subset Pset, nmax is the largest value in the subset nSet, and Kmax is an integer larger than 1024. The basic check matrix for the structured LDPC coding is obtained.

The basic check matrix has the following parameters: the number of system columns, kb, the number of rows (or check columns), mb, and the total number of columns, nb, where kb=nb−mb. The basic check matrix includes at least two types of elements: 1) elements each indicating an all-zero square matrix, denoted herein as −1 (which can instead be denoted as null or any other descriptor); and 2) elements each indicating a square matrix obtained by cyclically shifting an identity matrix (i.e., a non-all-zero matrix), denoted as an integer which is larger than or equal to 0 and smaller than the expansion factor and indicates the number of bits by which the identity matrix is cyclically shifted. The basic check matrix may also include a multi-sided structure, which means that it includes at least: two elements at the same pair of row index and column index, indicating a sum of two square matrices cyclically shifted by particular numbers of bits.

4. A data sequence to be encoded is encoded, or a data sequence to be decoded is decoded, based on the basic check matrix and the coding expansion factor z. The number of bits in the data sequence to be encoded is kb*z, and the length of the data sequence to be decoded is nb*z.

Further, Kmax equals to 2000, 2048, 4000, 4096, 6000, 6144, 8000, 8192, 12000 or 12288.

A more specific example is given here.

In the method for data processing with structured LDPC codes, the values of the expansion factor z are {4 6 8 10 12 14 16 20 24 28 32 40 48 56 64 80 96 112 128 160 192 224 256 320 384 448 512 640 768 896 1024} and the basic check matrix for the LDPC codes (corresponding to the maximum expansion factor of 1024) is:

```
   0    0    0    0    0    0    0    0    0   -1   -1   -1   -1   -1   -1   -1   -1   -1   -1   -1   -1   -1   -1   -1   -1
 913   -1   -1  993  566   -1  241    1  810    0   -1   -1   -1   -1   -1   -1   -1   -1   -1   -1   -1   -1   -1   -1   -1
1001  322  263  541  480  968  750    2   -1  391    0   -1   -1   -1   -1   -1   -1   -1   -1   -1   -1   -1   -1   -1   -1
  -1  829  936  428   -1  730   -1    2   -1   -1  322    0   -1   -1   -1   -1   -1   -1   -1   -1   -1   -1   -1   -1   -1
 931   -1   -1  592  289   -1    1   -1   -1   -1   -1  866    0   -1   -1   -1   -1   -1   -1   -1   -1   -1   -1   -1   -1
  -1  317    2   -1  983   -1   -1   -1   -1   -1   -1   -1    0   -1   -1   -1   -1   -1   -1   -1   -1   -1   -1   -1   -1
 877  840  476   -1   -1  711   -1   -1   -1   -1   -1   -1   -1    0   -1   -1   -1   -1   -1   -1   -1   -1   -1   -1   -1
 310   -1   -1   48   -1  568  882   -1   -1   -1   -1   -1   -1   -1    0   -1   -1   -1   -1   -1   -1   -1   -1   -1   -1
 889  241    2   -1   -1   -1   -1  392   -1   -1   -1   -1   -1   -1   -1    0   -1   -1   -1   -1   -1   -1   -1   -1   -1
 758    1   -1   -1   -1   -1   -1   -1  379   -1   -1   -1   -1   -1   -1   -1    0   -1   -1   -1   -1   -1   -1   -1   -1
 240   -1   -1   -1    1   -1   -1   -1   -1  576   -1   -1   -1   -1   -1   -1   -1    0   -1   -1   -1   -1   -1   -1   -1
 136  559   -1   -1   -1  638   -1   -1   -1   -1   -1   -1   -1   -1   -1   -1   -1   -1    0   -1   -1   -1   -1   -1   -1
  98  724   -1   -1   -1   -1    2   -1   -1   -1   -1  984   -1   -1   -1   -1   -1   -1   -1    0   -1   -1   -1   -1   -1
  -1  989  483   -1   -1   -1   -1   -1  169   -1   -1   -1   -1   -1   -1   -1   -1   -1   -1   -1    0   -1   -1   -1   -1
 893   -1  667   -1   -1    1   -1   -1   -1   -1  584   -1   -1   -1   -1   -1   -1   -1   -1   -1   -1    0   -1   -1   -1
 835    1   -1   -1   -1   -1  561   -1   -1   -1   -1   -1   -1   -1   -1   -1   -1   -1   -1   -1   -1   -1    0   -1   -1
  -1  215   -1   -1    1   -1   -1  526   -1   -1   -1   -1   -1   -1   -1   -1   -1   -1   -1   -1   -1   -1   -1    0   -1
 413  498   -1   -1   -1    1   -1   -1  180   -1   -1   -1   -1   -1   -1   -1   -1   -1   -1   -1   -1   -1   -1   -1    0
```

It can be seen from the above values of the expansion factor z that the expansion factor z is n times a positive integer p1. The positive integer p1 is an element of a subset Pset, and all values of the positive integer n constitute a subset nSet. Here, Pset equals to 2 to the power of a positive integer i, where i equals to {1 2 3 4 5 6 7}, i.e., Pset equals to {2 4 8 16 32 64 128}, and nSet equals to 12 3 5 6 7 81. In this way, the above set of values of the expansion factor can be obtained. It can be seen that it has more positive integer factors, which makes the decoder friendlier. That is, more degrees of parallelism of decoding can be used to satisfy throughput requirements in different scenarios. A high degree of parallelism of decoding can be used when a high throughput is desired, or a low degree of parallelism of decoding can be used when a low throughput is desired. The degree of parallelism of decoding is typically a positive integer factor of the expansion factor, otherwise the hardware implementation would be very complicated. In this example, Kmax=8000. The largest value in the subset Pset is plmax=128, and the largest value in the subset nSet is nmax=8. It can be seen that kb×plmax×nmax=8×128×8=8192, which satisfies Kmax≤kb×plmax×nmax≤1.2×Kmax.

The above basic matrix has the following characteristics. During a transmission process, when the coding rate R is higher than a base code RO, q*Z bits in q of the system columns of the corresponding basic matrix are not transmitted. In a sub-matrix of mb rows by q columns, composed of the q non-transmitted columns of the corresponding basic matrix, the difference between columns weights of any two columns of the sub-matrix is smaller than or equal to 1. Here, a column weight refers to the number of elements in the column that indicate a square matrix obtained by cyclically shifting an identity matrix. Alternatively, the difference between numbers of elements each indicating an all-zero square matrix in any two columns of the sub-matrix is smaller than or equal to 1. Each element indicating an all-zero square matrix is denoted as "−1" in this embodiment. Each element indicating a square matrix obtained by cyclically shifting an identity matrix is denoted as one integer ranging from 0 to Z−1 in this embodiment. In this embodiment, q=2.

According to the above encoding or decoding method, if the code block size obtained after the code block segmentation equals to 1024 bits, then the code block size for the structured LDPC coding is CBS=1024. The smallest value that is larger than or equal to CBS/kb=1024/8=256 is selected from the set of expansion factors, as the coding expansion factor for the structured LDPC codes. In this case, it is known that the expansion factor is 256. The basic check matrix is modified according to Embodiment 5 to obtain an encoding basic check matrix having an expansion factor of 256 (details thereof will be omitted here). The data sequence to be encoded and having a length of 1024 bits can be encoded based on the obtained expansion factor and the encoding basic check matrix. When the coding rate is ⅓, an LDPC codeword having a length of 3072 bits can be obtained. At a receiver, the data sequence to be decoded and having a length of 3072 bits can be decoded based on the obtained expansion factor and the encoding basic check matrix, to obtain decoded data having a length of 1024 bits. The decoded data of all code blocks can be combined to obtain the original data of the transport block transmitted from the transmitter.

The hardware implementation of the decoder as described in connection with Embodiment 3 can be used, which is advantageous in allowing the LDPC codes to support a flexible code length and a flexible code rate.

Embodiment 7

With the description of the above embodiments, it will be apparent to those skilled in the art that the method according to the above embodiments can be implemented by means of software plus a necessary general-purpose hardware platform. Of course it can be implemented in hardware, but in many cases the former is the optimal implementation. Based on this understanding, the technical solution of the present disclosure in essence, or parts thereof contributive to the prior art, can be embodied in the form of a software product. The computer software product can be stored in a storage medium (e.g., ROM/RAM, magnetic disk, or optical disc) and includes instructions for causing a terminal device (which may be a mobile phone, a computer, a server, or a network device, etc.) to perform the method described in the various embodiments of the present disclosure.

According to an embodiment of the present disclosure, a storage medium is also provided. In this embodiment, the storage medium can be configured to store program codes for the following steps.

At S1, a code block size for structured LDPC coding is obtained.

At S2, a coding expansion factor z is determined based on at least one of the code block size, a parameter kb of a basic check matrix, a positive integer value p or the basic check matrix having mb rows and nb columns.

At S3, a data sequence to be encoded is encoded, or a data sequence to be decoded is decoded, based on the basic check matrix and the coding expansion factor. Here, kb=nb−mb and each of kb, p, mb, z and nb is an integer larger than 1.

Optionally, in this embodiment, the above-described storage medium may include, but not limited to, a USB disk, a Read-Only Memory (ROM), a Random Access Memory (RAM), a mobile hard disk, a magnetic disk, an optical disc, or other mediums capable of storing program codes.

Optionally, in this embodiment, a processor performs the method steps according to the above embodiments in accordance with the program codes stored in the storage medium.

Optionally, for specific examples of this embodiment, reference can be made to those examples described in connection with the above embodiments and optional embodiments, and details thereof will be omitted here.

It can be appreciated by those skilled in the art that the above-described modules or steps of the present disclosure can be implemented by a general purpose computing device, and can be centralized at one single computing device or distributed over a network of multiple computing devices. Optionally, they can be implemented by means of computer executable program codes, which can be stored in a storage device and executed by one or more computing devices. In some cases, the steps shown or described herein may be performed in an order different from the one described above. Alternatively, they can be implemented separately in individual integrated circuit modules, or one or more of the modules or steps can be implemented in one single integrated circuit module. Thus, the present disclosure is not limited to any particular hardware, software, and combination thereof.

The foregoing is merely illustrative of the preferred embodiments of the present disclosure and is not intended to limit the present disclosure. Various changes and modifications may be made by those skilled in the art. Any modifications, equivalent alternatives or improvements that are made without departing from the spirits and principles of the present disclosure are to be encompassed by the scope of the present disclosure.

INDUSTRIAL APPLICABILITY

The present disclosure can be applied in the field of communications and is capable of improving the flexibility in data processing with LDPC coding, thereby solving the problem in the related art associated with low flexibility in data processing with LDPC coding.

What is claimed is:

1. A method for wireless communication, comprising:
   determining a code block size for Low Density Parity Check (LDPC) coding;
   determining a coding expansion factor Z from a set of coding expansion factors based on the code block size and a parameter kb associated with a basic check matrix, wherein the parameter kb is an integer larger than or equal to four and smaller than or equal to 64, and wherein the coding expansion factor Z is equal to a positive integer power of two minus one or a product of a positive integer power of two and a prime number; and
   encoding a data sequence based on the basic check matrix and the coding expansion factor Z.

2. The method of claim 1, wherein the prime number comprises one of: 3, 5, 7, 11, or 13.

3. The method of claim 1, wherein the set of coding expansion factors includes at least 6, 12, 24, 48, 96, 192, and 384.

4. The method of claim 1, wherein the set of coding expansion factors includes at least 10, 20, 40, 80, 160, and 320.

5. The method of claim 1, wherein the set of coding expansion factors includes at least 14, 28, 56, 112, and 224.

6. An apparatus for digital communications, comprising a processor that is configured to:
   determine a code block size for Low Density Parity Check (LDPC) coding;
   determine a coding expansion factor Z from a set of coding expansion factors based on the code block size and a parameter kb associated with a basic check matrix, wherein the parameter kb is an integer larger than or equal to four and smaller than or equal to 64, and wherein the coding expansion factor Z is equal to a positive integer power of two minus one or a product of a positive integer power of two and a prime number; and
   encode a data sequence based on the basic check matrix and the coding expansion factor Z.

7. The apparatus of claim 6, wherein the prime number comprises one of: 3, 5, 7, 11, or 13.

8. The apparatus of claim 6, wherein the set of coding expansion factors includes at least 6, 12, 24, 48, 96, 192, and 384.

9. The apparatus of claim 6, wherein the set of coding expansion factors includes at least 10, 20, 40, 80, 160, and 320.

10. The apparatus of claim 6, wherein the set of coding expansion factors includes at least 14, 28, 56, 112, and 224.

11. A non-transitory computer readable medium having code stored thereon, the code when executed by a processor, causing the processor to implement a method that comprises:
    determining a code block size for Low Density Parity Check (LDPC) coding;
    determining a coding expansion factor Z from a set of coding expansion factors based on the code block size and a parameter kb associated with a basic check matrix, wherein the parameter kb is an integer larger than or equal to four and smaller than or equal to 64, and wherein the coding expansion factor Z is equal to a positive integer power of two minus one or a product of a positive integer power of two and a prime number; and
    encoding a data sequence based on the basic check matrix and the coding expansion factor Z.

12. The non-transitory computer readable medium of claim 11, wherein the prime number comprises one of: 3, 5, 7, 11, or 13.

13. The non-transitory computer readable medium of claim 11, wherein the set of coding expansion factors includes at least 6, 12, 24, 48, 96, 192, and 384.

14. The non-transitory computer readable medium of claim 11, wherein the set of coding expansion factors includes at least 10, 20, 40, 80, 160, and 320.

15. The non-transitory computer readable medium of claim 11, wherein the set of coding expansion factors includes at least 14, 28, 56, 112, and 224.

* * * * *